United States Patent
Miwa

(10) Patent No.: US 10,665,568 B2
(45) Date of Patent: May 26, 2020

(54) ENCAPSULATED CIRCUIT MODULE, AND PRODUCTION METHOD THEREFOR

(71) Applicant: MEIKO ELECTRONICS CO., LTD., Ayase-shi, Kanagawa (JP)

(72) Inventor: Satoru Miwa, Nagoya (JP)

(73) Assignee: MEIKO ELECTRONICS CO., LTD., Kanagawa (JP)

(*) Notice: Subject to any disclaimer, the term of this patent is extended or adjusted under 35 U.S.C. 154(b) by 281 days.

(21) Appl. No.: 15/534,277

(22) PCT Filed: Dec. 12, 2014

(86) PCT No.: PCT/JP2014/082954
§ 371 (c)(1),
(2) Date: Jun. 8, 2017

(87) PCT Pub. No.: WO2016/092691
PCT Pub. Date: Jun. 16, 2016

(65) Prior Publication Data
US 2017/0345789 A1    Nov. 30, 2017

(51) Int. Cl.
*H01L 21/56*    (2006.01)
*H01L 23/00*    (2006.01)
(Continued)

(52) U.S. Cl.
CPC ............. *H01L 24/97* (2013.01); *H01L 21/56* (2013.01); *H01L 21/6715* (2013.01);
(Continued)

(58) Field of Classification Search
CPC ...... H05K 9/0088; H05K 3/102; H05K 3/284; H05K 3/28; H05K 3/107; H05K 3/12;
(Continued)

(56) References Cited

U.S. PATENT DOCUMENTS 5,600,181 A * 2/1997 Scott ............... H01L 23/31
257/723
6,841,454 B2 * 1/2005 Nishiyama ....... H01L 21/561
257/E25.023
(Continued)

FOREIGN PATENT DOCUMENTS

JP    63090845 A    4/1988
JP    2010219210 A    9/2010
(Continued)

OTHER PUBLICATIONS

PCT Notification of Transmittal of Translation of the International Preliminary Report on Patentability (Chapter I) dated Jun. 22, 2017 in International Application No. PCT/JP2014/082954.
(Continued)

*Primary Examiner* — Peter Dungba Vo
*Assistant Examiner* — Kaying Kue
(74) *Attorney, Agent, or Firm* — Plumsea Law Group, LLC

(57) ABSTRACT

To provide a technique of preventing, in an encapsulated circuit module having a metal shield layer covering a surface of a resin layer containing filler, the shield layer from falling off.
In manufacturing encapsulated circuit modules, first, a substrate 100 is covered with a first resin 400 containing filler together with an electronic component 200. Next, a surface of the first resin 400 is covered with a second resin 500 containing no filler. Subsequently, a ground electrode 110 in the substrate 100 is exposed by snicking and then a shield layer 600 that covers the entire surface of the substrate 100 is formed by electroless plating. Thereafter, snipping is performed to obtain a number of encapsulated circuit modules.

20 Claims, 28 Drawing Sheets

(51) Int. Cl.
*H01L 23/31* (2006.01)
*H01L 23/552* (2006.01)
*H01L 23/66* (2006.01)
*H01L 21/67* (2006.01)
*H01L 23/29* (2006.01)
*H05K 9/00* (2006.01)
*H01L 23/556* (2006.01)

(52) U.S. Cl.
CPC .......... *H01L 23/29* (2013.01); *H01L 23/3121* (2013.01); *H01L 23/552* (2013.01); *H01L 23/66* (2013.01); *H05K 9/0088* (2013.01); *H01L 21/561* (2013.01); *H01L 2223/6677* (2013.01); *H01L 2924/1815* (2013.01); *H01L 2924/3025* (2013.01)

(58) Field of Classification Search
CPC . H05K 3/14; H05K 3/15; H05K 13/04; H01L 24/97; H01L 23/3121; H01L 21/6715; H01L 21/56; H01L 21/29; H01L 23/552; H01L 23/66; H01L 21/561; H01L 2924/1815; H01L 2924/3025; H01L 2223/6677; Y10T 29/49165; Y10T 29/49146
USPC .......................................... 29/852, 841, 832
See application file for complete search history.

(56) References Cited

U.S. PATENT DOCUMENTS

| | | | | |
|---|---|---|---|---|
| 6,975,516 B2* | 12/2005 | Asahi | .................. | H01L 21/6835 174/258 |
| 7,478,474 B2* | 1/2009 | Koga | .................... | H01L 21/561 257/660 |
| 7,633,015 B2* | 12/2009 | Wurzel | ................. | H01L 23/552 174/260 |
| 7,989,928 B2* | 8/2011 | Liao | ...................... | H01L 21/568 257/659 |
| 8,022,511 B2* | 9/2011 | Chiu | ..................... | H01L 21/568 257/659 |
| 10,271,432 B2 | 4/2019 | Miwa | | |
| 2004/0154163 A1* | 8/2004 | Miyazaki | ............ | H01L 23/3107 29/832 |
| 2009/0194851 A1* | 8/2009 | Chiu | ..................... | H01L 21/568 257/660 |
| 2009/0236700 A1* | 9/2009 | Moriya | ................... | H01L 24/83 257/659 |
| 2009/0294928 A1* | 12/2009 | Kim | ...................... | H01L 21/561 257/659 |
| 2010/0072582 A1* | 3/2010 | Chandra | ............... | H01L 21/561 257/659 |
| 2010/0172116 A1* | 7/2010 | Yorita | ................... | H01L 21/565 361/816 |
| 2012/0193770 A1* | 8/2012 | Yamada | ................ | H01L 21/561 257/659 |
| 2013/0155639 A1* | 6/2013 | Ogawa | ................ | H01L 23/5389 361/816 |
| 2014/0326484 A1* | 11/2014 | Tajima | ................. | H05K 9/0088 174/250 |
| 2015/0250080 A1* | 9/2015 | Haruna | ................ | H05K 1/0215 174/394 |

FOREIGN PATENT DOCUMENTS

| | | |
|---|---|---|
| JP | 2010278421 A | 12/2010 |
| JP | 2011171436 A | 9/2011 |
| JP | 2012-019091 A | 1/2012 |
| JP | 2012160634 A | 8/2012 |
| JP | 2014107372 A | 6/2014 |
| JP | 2014175485 A | 9/2014 |
| WO | 2007083352 A1 | 7/2007 |
| WO | 2010041356 A1 | 4/2010 |
| WO | WO-2014010342 A1 * | 1/2014 ........... H05K 1/0215 |

OTHER PUBLICATIONS

PCT Notification Concerning Transmittal of International Preliminary Report on Patentability (Chapter I of the Patent Cooperation Treaty) dated Jun. 22, 2017 in International Application No. PCT/JP2014/082954.
Office Action dated May 18, 2018 in U.S. Appl. No. 15/534,401.
Office Action dated Aug. 16, 2018 in U.S. Appl. No. 15/534,401.
Amendment filed Nov. 13, 2018 in U.S. Appl. No. 15/534,401.
Office Action dated Oct. 6, 2015 in Japanese Patent Application No. 2015-533356, and English translation thereof.

* cited by examiner

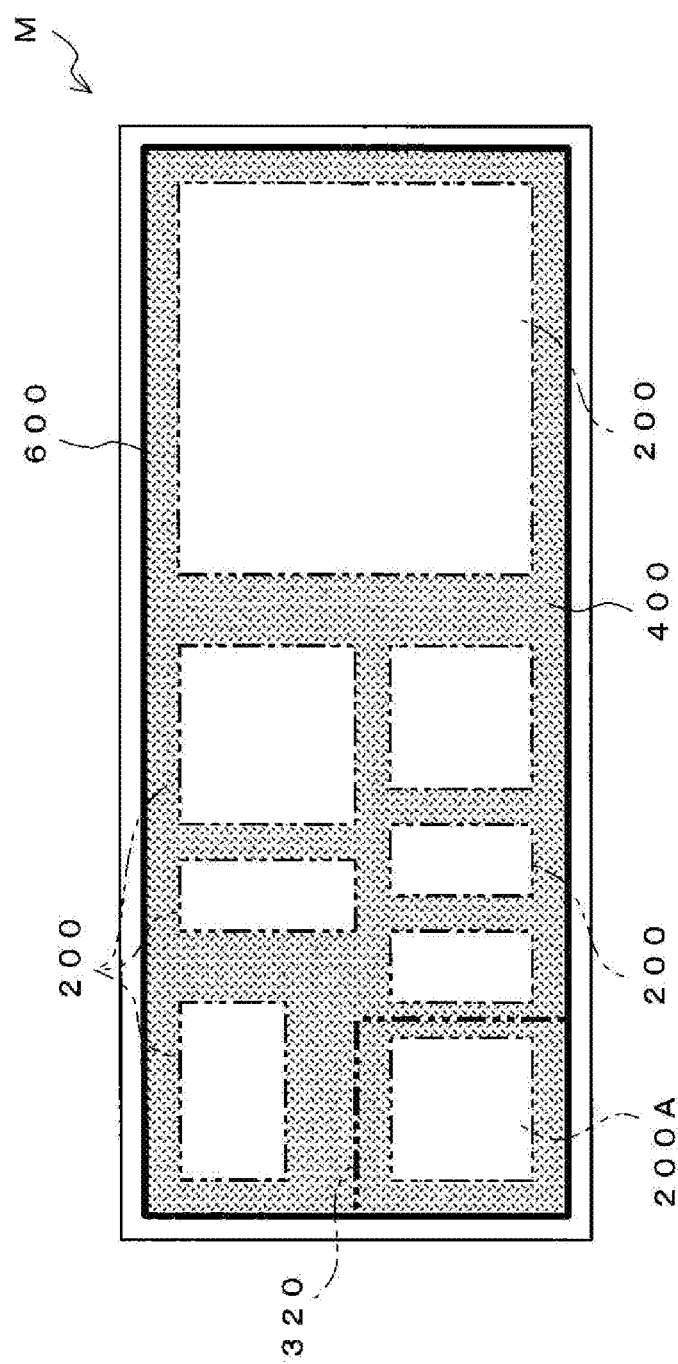

ENCAPSULATED CIRCUIT MODULE, AND PRODUCTION METHOD THEREFOR

This application is a national stage application of International Patent Application No. PCT/JP2014/082954, filed Dec. 12, 2014 (WO 2016/092691 A1, published Jun. 16, 2016), which is herein incorporated by reference in its entirety.

TECHNICAL FIELD

The present invention relates to encapsulated circuit modules.

BACKGROUND ART

Encapsulated circuit modules are known.

Encapsulated circuit modules include a substrate having wiring (such as a printed wiring board), electronic components mounted so as to be electrically connected with the wiring of the substrate, and a resin covering the substrate together with the electronic components. By covering the electronic components with the resin, encapsulated circuit modules can provide protection for electronic components and protection of electrical contacts between the electronic components and the wiring of the substrate.

Encapsulated circuit modules include electronic components as described above. Some electronic components are vulnerable to electromagnetic waves. Other electronic components emit electromagnetic waves.

In many situations where an encapsulated circuit module is actually used, the encapsulated circuit module is combined with other electronic components. Such other electronic components may be included in another encapsulated circuit module or not. Moreover, some other electronic components are vulnerable to electromagnetic waves and others emit electromagnetic waves.

When the encapsulated circuit module is actually used, it may be desired in some cases to reduce the influence of the electromagnetic waves emitted by other electronic components outside the encapsulated circuit module on the electronic components included in the encapsulated circuit module. It may also be desired in other cases to reduce the influence of the electromagnetic waves emitted by the electronic component(s) included in the encapsulated circuit module on other electronic component(s) outside the encapsulated circuit module.

From such a viewpoint, for circuit modules without having been subjected to encapsulation with a resin, a technique of surrounding the entire circuit module with a metal shield against electromagnetic waves is practically used.

An exemplified metal shield is a box formed of a thin metal plate, with one side open. When using a box, the circuit module is not usually encapsulated with a resin. The box is attached to the substrate with the edge defining the opening of the box being in contact with the substrate to enclose the electronic components and thereby to shield the electronic components.

When, however, a box is used, the height from the substrate to the upper surface of the box often becomes relatively great, and the thickness of the circuit module thus tends to be great. Where boxes are used, it takes time and cost to make these boxes. Different kinds of boxes, if prepared depending on the height of electronic components, further increase the process steps and costs required for making the boxes. As a result, the height of the box may possibly be unnecessarily great relative to the height of the electronic component(s) on the substrate.

Since the thickness of the circuit module has a great influence on the dimensions of the final product in which it is incorporated, making it smaller is of great value. Boxes, however, often increase the thickness of the circuit module.

Another technique has been suggested for encapsulated circuit modules in which a metal shield layer is formed on the surface of the resin used for encapsulation by applying a paste containing metal powder to the surface of the resin or plating such surface with a metal using a dry or wet process. The process of applying a paste and a sputtering process, which is a kind of a dry metal-plating, have been practically used. With these processes, the problem of an excessive thickness of the encapsulated circuit module can be prevented.

SUMMARY OF INVENTION

Technical Problem

As described above, the techniques of forming a shield layer by applying a paste containing metal powder to the surface of the resin or plating such surface with a metal are excellent techniques when focusing on the reduction of the thickness of the encapsulated circuit module. Even such techniques, however, have room for improvement.

A resin forming a resin layer of encapsulated circuit modules usually contains fillers. The filler is in the form of granules. In addition, since the filler is made of a material having a linear expansion coefficient that is different from that of the resin and thereby serves to suppress the thermal expansion and contraction of the encapsulated circuit modules, it is essential for the encapsulated circuit modules at the present time.

On the other hand, when a shield layer is formed by applying a paste containing metal powder to the surface of the resin mixed with filler or plating such surface with a metal, the shield layer may fall off. The filler which is present on the surface of the resin layer and is exposed from the resin layer may be likely to fall off from the resin layer. This falling of the filler from the resin layer, if any, results in fall off of the shielding layer.

An object of the present invention is to improve a technique of forming a shield layer in an encapsulated circuit module by applying a paste containing metal powder to the surface of a resin layer, or by plating such surface with a metal to reduce a possibility that the shield layer falls off.

Solution to Problem

In order to solve the aforementioned problem, the present inventor suggests the following inventions.

The present invention is a method of manufacturing encapsulated circuit modules including: a first covering step for entirely covering a surface of a substrate with a first resin containing filler together with electronic components and curing the first resin, the surface of the substrate having a plurality of contiguous assumed sections, each of the sections having at least one of the electronic components mounted thereon, the substrate having a ground electrode; a second covering step for covering a surface (upper surface) of the first resin covering the substrate with a second resin containing no filler and curing the second resin; a snicking step for removing a predetermined width of the second resin, the first resin and the substrate to a predetermined depth of the substrate, the predetermined width including a boundary between the adjacent assumed sections; a shield layer-forming step for forming a metal shield layer on a surface of the second resin and side surfaces of the second resin, the first resin and the substrate exposed by the snicking step, by applying a paste containing metal powder or metal-plating, the shield layer being electrically connected with the ground electrode; and a snipping step for separating the sections by cutting the substrate along the boundaries between the sections to obtain a plurality of the encapsulated circuit modules corresponding to the sections.

The first resin in the present invention corresponds to the resin contained in the encapsulated circuit modules described in the related art. Like the resin in the related art, the first resin contains filler.

On the other hand, in the present invention, the surface of the first resin is further covered with the second resin. The second resin does not contain filler. In the present invention, the shield layer which is a metal layer electrically connected with the ground electrode is formed on the surface of the second resin and the side surfaces of the second resin, the first resin and the substrate exposed by the snicking step performed before the snipping for dicing. The second resin does not contain filler as described above. The shield layer thus formed does not have a problem of falling off which otherwise can occur due to the falling off of the filler.

Even in the method of the present application, the portion of the shield layer that covers the side surface of the first resin covers the first resin without the interposed second resin. The present inventor has found, however, that the side surface of the first resin is roughened appropriately as a result of the snicking step performed in an ordinary method and that the shield layer adheres to the first resin well and is thus less likely to be separated.

The shield layer (or the first and second metal covering layers thereof described later) is formed by applying a paste containing metal powder or by metal-plating. The metal-plating may be either wet plating or dry plating. Examples of the wet plating include electrolytic plating and electroless plating. Examples of the dry plating include physical vapor deposition (PVD) and chemical vapor deposition (CVD). Examples of the former include sputtering and vacuum vapor deposition and examples of the latter include thermal CVD and photo CVD.

Of these, wet plating is the most advantageous in consideration of costs. Besides, the residual stress in the metal coating layer (shield layer) formed by wet plating is lower than the residual stress in shield layers made by another method, so the wet plating is suitable for application to the present invention. Furthermore, the thickness of the shield layer obtained by PVD or CVD, which is a technique of thin film formation, ranges from the order of nanometers to several micrometers whereas the wet plating can provide a thicker film ranging from several micrometers to several tens micrometers. Considering the shielding effect against electromagnetic waves, it is preferable that the shield layer has a thickness of at least several micrometers so that the wet plating is compatible with the present invention in that respect as well. On the other hand, when the wet plating is used for forming the shield layer, the shield layer is more likely to fall off due to falling off of the filler if no layer of the second resin is present. The present invention is also useful in that the wet plating can be selected in the process of forming the shield layer in manufacturing the encapsulated circuit modules. Although wet plating includes electrolytic plating and electroless plating, it is preferable to use electroless plating that does not require any flow of electrical current through surfaces of the encapsulated circuit modules to be processed rather than the electrolytic plating requiring a flow of electrical current, in consideration of possible damages of the electronic components in the encapsulated circuit modules.

The shield layer of the present invention is electrically connected with the ground electrode of the substrate. The shield layer may be either in direct contact with the ground electrode or in indirect contact with the ground electrode via another electrically conductive metal as long as it is electrically connected with the ground electrode. For example, the ground electrode may be embedded in the substrate at a predetermined depth. In such cases, the first resin and the substrate are removed at a predetermined width across the boundaries between the sections in the snicking step to the depth reaching the ground electrode in the substrate, which exposes the edge of the ground electrode on the periphery of each section. In this state, by applying a paste containing metal powder or performing metal-plating, the shield layer is directly in contact with the exposed edge of the ground electrode. Alternatively, the shield layer can be electrically connected with the ground electrode using an appropriate metal member such as a partition member as will be described in the section of Description of Embodiments.

As described above, according to the present invention, at least the portion of the upper surface of the first resin covered with the shield layer is covered with the second resin, which prevents the shield layer from falling off due to falling off of the filler. In the present invention, however, since the shield layer is formed on the first resin with the second resin interposed therebetween, when the second resin falls off from the first resin, the shield layer falls off accordingly.

In order to prevent the second resin from falling off from the first resin, adhesion of the second resin to the first resin is important. This adhesion is achieved by an anchor effect, an intermolecular force, and some covalent bond between the first resin and the second resin.

In order to improve the adhesion of the second resin to the first resin, it is easy to use a same type of resin as that contained as a major resin component in the first resin as the second resin. In the present application, the term "major resin" means the resin of the first resin if a single resin constitutes the first resin and means a resin contained at the highest ratio if different kinds of resins constitute the first resin.

When the resin contained in the first resin as the major resin component is an epoxy resin, the second resin can be an epoxy resin. With this, the adhesion between the first resin and the second resin becomes large enough to be practical.

As described above, the second resin covers at least the portion of the first resin on one side which is covered with the shield layer. It is better that the thickness of the second resin is thin enough to such an extent that, for example, the falling off of the filler from the first resin can be prevented by covering the filler exposed on the first resin and the strength of the second resin can be maintained. The thinning of the layer of the second resin is advantageous in the case where the shield layer is formed by metal-plating because the roughening in the subsequent process is easy. For example, it is preferable that the layer of the second resin is thinned to such an extent that the uneven surface of the first resin is not flattened.

The shield layer of the present application has a function of reducing the influence of electromagnetic waves generated by the electronic component(s) outside the encapsulated circuit module on the electronic component(s) in the encapsulated circuit module or a function of reducing the influence of electromagnetic waves generated by the electronic component(s) in the encapsulated circuit module on the electronic component(s) outside the encapsulated circuit module. As long as the shield layer has such a function, it may be made of any metal.

The shield layer may be a single layer or it may have two or more layers. The metal constituting the respective layers may be the same, but can be different.

In the present invention, the shield layer can be formed as including a first metal layer and a second metal layer, the first metal layer including a first metal having an excellent shielding property against an electric field, and the second metal layer including a second metal having an excellent shielding property against a magnetic field.

If the shield layer has such two layers, it is possible to protect the electronic component(s) from electromagnetic waves more efficiently.

Copper or iron can be used as an example of the first metal.

Nickel can be used as an example of the second metal.

Either the first metal covering layer or the second metal covering layer may be exposed outside. In any case, the aforementioned functions are not affected. When, however, copper is used as the first metal, it is better not to expose the first metal covering layer comprising copper in consideration of the appearance, because copper can turn black as a result of oxidation.

In the present invention, after the first covering step, a first resin shaping step for scraping the surface of the cured first resin can be performed such that the surface of the cured first resin becomes parallel to the surface of the substrate, and the second covering step can be performed to the surface of the first resin generated by the first resin shaping step.

When a number of electronic components are mounted on an encapsulated circuit module, it is possible that the heights of these electronic components are different from each other. In that case, the surface of the first resin may become uneven. By performing the first resin shaping step for scraping the surface of the cured first resin such that that surface becomes parallel to the surface of the substrate, the thickness of the encapsulated circuit module can be reduced because the thickness of the first resin on the tallest electronic component can be reduced up to a necessary minimum thickness. When the first resin is applied to the substrate, the thickness of the first resin on the tallest electronic component can be controlled to some extent, but the accuracy of this control is not high. In the first resin shaping step, the thickness of the first resin on the tallest electronic component is controlled by, for example, mechanical cutting, of which accuracy is generally ±35 μm. In general, the thickness of the first resin on the tallest electronic component cannot be reduced to smaller than about 500 μm, but by providing the first resin shaping step, the thickness of the first resin can be reduced to 100 μm or smaller, and in some cases, to about 80 μm.

It should be noted that, when the first resin shaping step is performed, the filler in the cured first resin may sometimes tend to fall off easily. In the present invention, however, the second covering step is performed thereafter to cover the surface of the first resin with the second resin. Accordingly, falling off of the shield layer due to the falling off of the filler will not occur.

In the first covering step, entire covering of one surface of the substrate with the first resin containing filler together with the electronic components can be achieved using any method. For example, vacuum printing can be used for such a purpose.

By using vacuum printing, it is possible to prevent any fine voids from being incorporated into the cured first resin, and to cover electronic components having various shapes with the first resin without any gaps.

However, when vacuum printing is used in the first covering step, irregularities due to the difference in height of the electronic components will inevitably appear on a resin layer present on the components attached to the substrate if the layer is thin. In order to avoid this, when vacuum printing is used, it is necessary to give a margin to the thickness of the first resin on the electronic components, which results in a disadvantage that the completed encapsulated circuit modules become thick. The first resin shaping step can solve this. The first resin shaping step is well compatible with vacuum printing and can be considered as a technique that allows the vacuum printing to be used for the manufacture of the encapsulated circuit modules.

The first resin is required to have three properties, i.e., a penetrability (which is a property before being cured) to allow the first resin to enter between the electronic components, an adhesion to the electronic components as well as the substrate, and an anti-warping feature (which is a property after being cured).

In order to achieve these properties of the first resin, it is preferable that the first resin has the following characteristics. If the first resin has the following characteristics, the aforementioned requirements for the properties of the first resin before and after curing are both met.

The characteristics that the first resin should have are that it contains the filler at an amount of 80% by weight or more relative to the total weight of the first resin containing the filler before being cured and has a linear expansion coefficient ($\alpha 1$) of 11 ppm/TMA or lower, a linear expansion coefficient ($\alpha 2$) of 25 ppm/TMA or lower, and a modulus of elasticity at 25° C. of 15 GPa/DMA or lower after being cured.

Of the characteristics required for the first resin, a high penetrability contributes to reducing the thickness of the completed encapsulated circuit modules. In general, a gap is present between the lower side of the electronic component and the substrate. The gap should be determined to have such a size that the first resin can be poured into the gap. A higher penetrability of the first resin makes it possible to reduce the gap between the lower side of the electronic component and the substrate. This in turn reduces the thickness of the encapsulated circuit module. With the resin having the aforementioned characteristics, the gap between the lower side of the electronic component and the substrate can be reduced to as small as 30 μm (in general, the gap is between 150 and 200 μm).

The present invention proposes the following encapsulated circuit module as an aspect of the present invention.

The encapsulated circuit module includes a substrate having a ground electrode; at least one electronic component mounted on a surface of the substrate; a first resin layer comprising a first resin containing filler, the first resin layer covering the surface of the substrate together with the electronic component; a second resin layer comprising a second resin containing no filler, the second resin layer covering the surface of the first resin layer; and a shield layer comprising metal, the shield layer being formed by covering a surface of the second resin layer and side surfaces of the first resin layer and the substrate such that the metal shield layer is electrically connected with the ground electrode.

The shield layer of this encapsulated circuit module is fixed to the first resin layer via the second resin layer. Therefore, it is possible to prevent the shield layer from falling off due to falling off of the filler in the first resin layer containing the filler. In particular, when the shield layer is formed by electroless plating, it is advantageous in terms of costs.

BRIEF DESCRIPTION OF DRAWINGS

FIG. 1(j) A side cross-sectional view showing a state in which the substrate shown in FIG. 1(i) has been subjected to snipping.

FIG. 6 A transparent plan view of an encapsulated circuit module obtained by the method of manufacturing encapsulated circuit modules according to the embodiment.

DESCRIPTION OF EMBODIMENTS

Hereinafter, a preferred embodiment of a method of manufacturing encapsulated circuit modules of the present invention will be described with reference to the drawings.

Figure 1A:
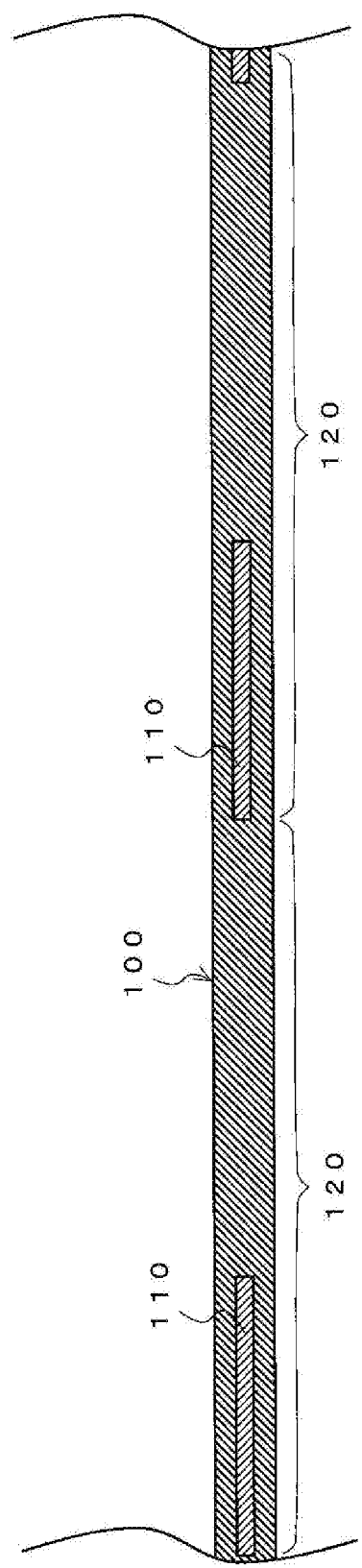
FIG. 1(a) A side cross-sectional view showing a configuration of a substrate used in a method of manufacturing encapsulated circuit modules according to an embodiment of the present invention.

In this embodiment, encapsulated circuit modules are manufactured using a substrate 100 shown in FIG. 1(a).

The substrate 100 may be an ordinary substrate, and the substrate 100 in this embodiment is also an ordinary one. The substrate 100 has wiring not shown. The wiring is electrically connected with electronic components described later, and supplies electricity to the electronic components. The wiring is known or widely known and is designed to provide the functions just mentioned. The wiring may be provided on the substrate 100 by any means, and may be provided anywhere on the substrate 100. For example, the wiring may be provided by printing on the surface of the substrate 100. In that case, the substrate 100 is generally referred to as a printed wiring board. The wiring may also be present inside the substrate 100.

When seen from the above, the shape of the substrate 100 is, for example, a rectangle. The shape of the substrate 100 is, however, usually determined as appropriate so as to reduce waste when a plurality of encapsulated circuit modules are formed as described later.

At appropriate positions of the substrate 100, ground electrode 110 is provided. In some cases, ground electrode 110 may be entirely or partially present in the substrate 100, or may be entirely or partially present on a surface of the substrate 100. In this embodiment, it is assumed that ground electrode 110 is embedded as a layer in the substrate 100 at an appropriate depth. The ground electrodes 110 are used to ground a shield layer described later when the final encapsulated circuit module is used. The ground electrodes 110 are designed to allow this.

In the method of manufacturing encapsulated circuit modules described in this embodiment, a large number of encapsulated circuit modules are manufactured from one substrate 100. That is, in this embodiment, multiple encapsulated circuit modules are obtained from a single substrate 100. The substrate 100 is divided into a large number of contiguous assumed sections 120, and each section 120 corresponds to a single encapsulated circuit module manufactured. The encapsulated circuit modules manufactured in association with the respective sections 120 are not necessarily identical, but are usually identical with each other. In the case where the encapsulated circuit modules manufactured in association with these sections 120 are identical with each other, each section 120 has the same size, and each section 120 is provided with wiring and a ground electrode 110 in the same pattern. In this embodiment, it is assumed that the encapsulated circuit modules of these sections 120 are identical with each other, but not limited thereto.

Figure 1B:
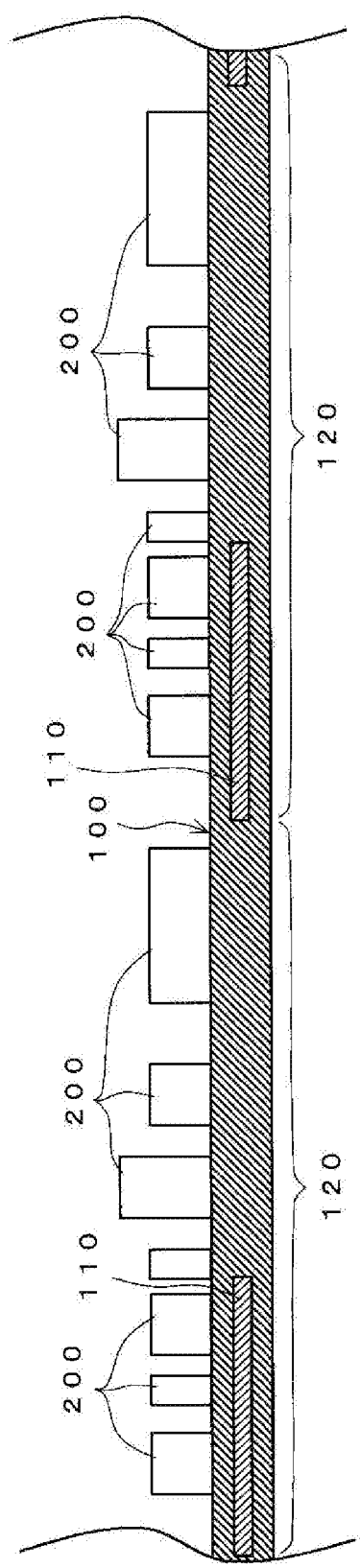
FIG. 1(b) A side cross-sectional view showing a state in which electronic components are mounted on the substrate shown in FIG. 1(a).

In order to manufacture the encapsulated circuit modules, first, as shown in FIG. 1(b), the electronic components 200 are attached to one surface (the upper surface in FIG. 1(b) in this embodiment) of the substrate 100. All of the electronic components 200 may be conventional ones and are selected as necessary from, for example, active devices such as integrated circuit (IC) amplifiers, oscillators, wave detectors, transceivers, etc., or passive devices such as resistors, capacitors, coils, etc.

The electronic components 200 are attached to the respective sections 120 with their terminals (not shown) electrically connected with the wirings of the respective sections 120. In this embodiment, since the identical encapsulated circuit modules are obtained in association with the respective sections 120, identical sets of the electronic components 200 are mounted on the respective sections 120. A known or widely-known technique may be used for attaching the electronic components 200 to each section 120, so a detailed description thereof will be omitted.

The gap between the lower side of the electronic component 200 and the substrate 100 may be smaller than usual, for example, on the order of 30 μm.

Figure 1C:
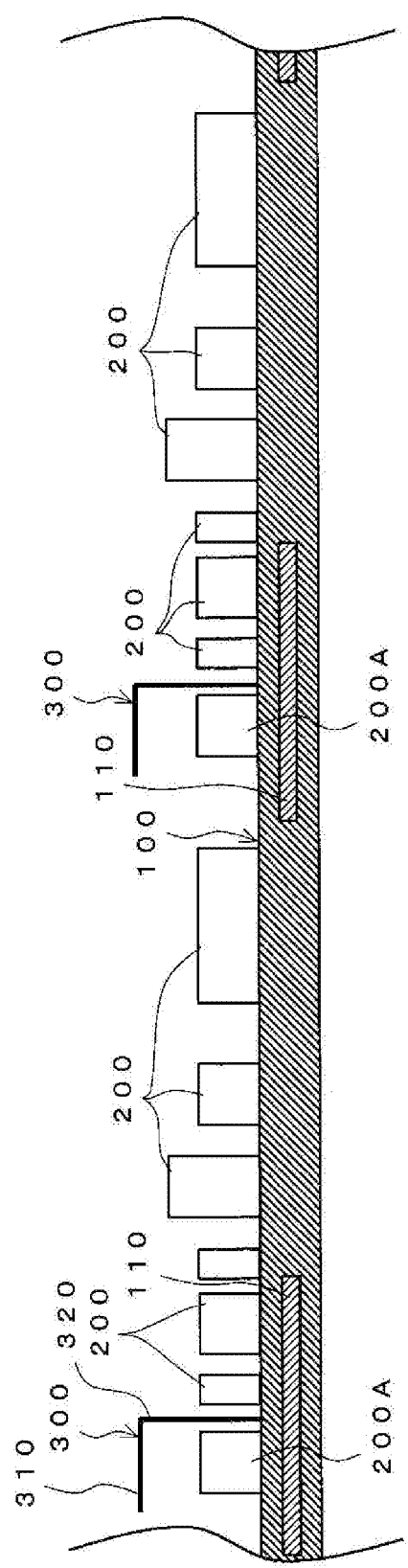
FIG. 1(c) A side cross-sectional view showing a state in which a partition member is attached to the substrate shown in FIG. 1(b).

Next, in this embodiment, although not necessarily required, a partition member 300 is attached to the substrate 100 (FIG. 1(c)). The partition member 300 is a member for forming a partition in the encapsulated circuit module. The partition is intended to reduce the influence of electromagnetic waves produced by the electronic component(s) 200 in the encapsulated circuit module on other electronic component(s) 200 in the same encapsulated circuit module. Note that the partition member 300 may be used as necessary when the following circumstances exist, and is not essential.

For example, in this embodiment, when an electronic component 200A shown in FIG. 1(c) is a high-frequency oscillator, a strong electromagnetic wave is emitted by the electronic component 200A. In such a case and in the case where the electronic components 200 around the electronic component 200A are vulnerable to noises due to strong electromagnetic waves, deteriorating their functions, it is necessary to protect them from the electromagnetic waves emitted by the electronic component 200A. Alternatively, it is conceivable that the electronic component 200A is particularly susceptible to electromagnetic waves emitted by other electronic component(s) 200. In such a case, the electronic component 200A should be protected from the electromagnetic waves emitted by other electronic component(s) 200. In any cases, it is preferable to shield electromagnetic waves between the electronic component 200A and other electronic component(s) 200. The partition provided by the partition member 300 makes this possible.

The partition member 300 is made of a metal having conductivity so as to shield electromagnetic waves, and is electrically connected with the ground electrode 110 directly or through a shield layer which will be described later in the encapsulated circuit module manufactured. The partition member 300 is designed so that the partition achieved by the partition member 300 alone or a combination of the partition achieved by the partition member 300 and the shield layer described later stretches around (one or more) certain electronic component(s) 200, when the substrate 100 is seen from the above.

Figure 2A:
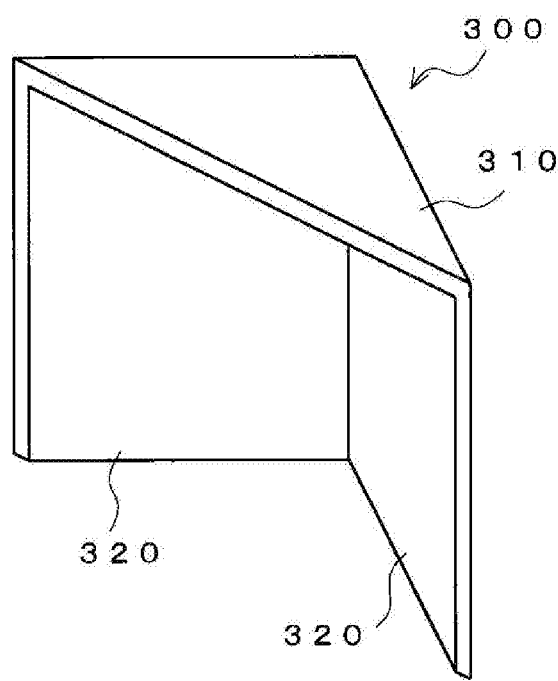
FIG. 2(a) A perspective view showing a configuration of a partition member used in a method of manufacturing encapsulated circuit modules of an embodiment.

Although not limited thereto, the partition member 300 in this embodiment has a shape as shown in FIG. 2(a). The partition member 300 comprises a roof 310 which is a triangle, more specifically a right triangle when viewed from the above, and rectangular side walls 320 connected with the two sides other than the hypotenuse of the roof 310 with the sides of the side walls 320 adjacent to each other being connected with each other. The partition made by the partition member 300 in this embodiment is designed to be electrically connected with the shield layer when the encapsulated circuit module is completed. For example, the partition made by the partition member 300 is electrically connected to the shield layer on a side of the encapsulated circuit module when it is completed, with the sides of the respective side walls 320 opposite to their sides adjacent to each other being in contact with the shield layer. This will be described later.

Attachment of the partition member 300 to the substrate 100 may be performed in any manner. For example, the partition member 300 can be attached to the substrate 100 by adhesion. If, for example, a lower end of the partition member 300 is electrically connected with the ground electrode 110, the ground electrode 110 and the partition member 300 can be designed for that purpose and the ground electrode 110 and the partition member 300 can be adhered to each other using a known conductive adhesive or the like. For example, lower ends of the side walls 320 of the partition member 300 can be brought into contact with and electrically connected with the ground electrode 110 which is exposed from the surface of the substrate 100 from the beginning or which is exposed from the substrate 100 by scraping off the surface of the substrate 100.

The partition member 300 is only required to be electrically connected with the ground electrode 110 at the end of the manufacture. In other words, the partition member 300 may be in direct contact with the ground electrode 110, or in indirect contact with the ground electrode 110 via another conductive metal (for example, a shield layer). Of course, if one of these is achieved, the other is not need to be achieved.

Figure 2B:
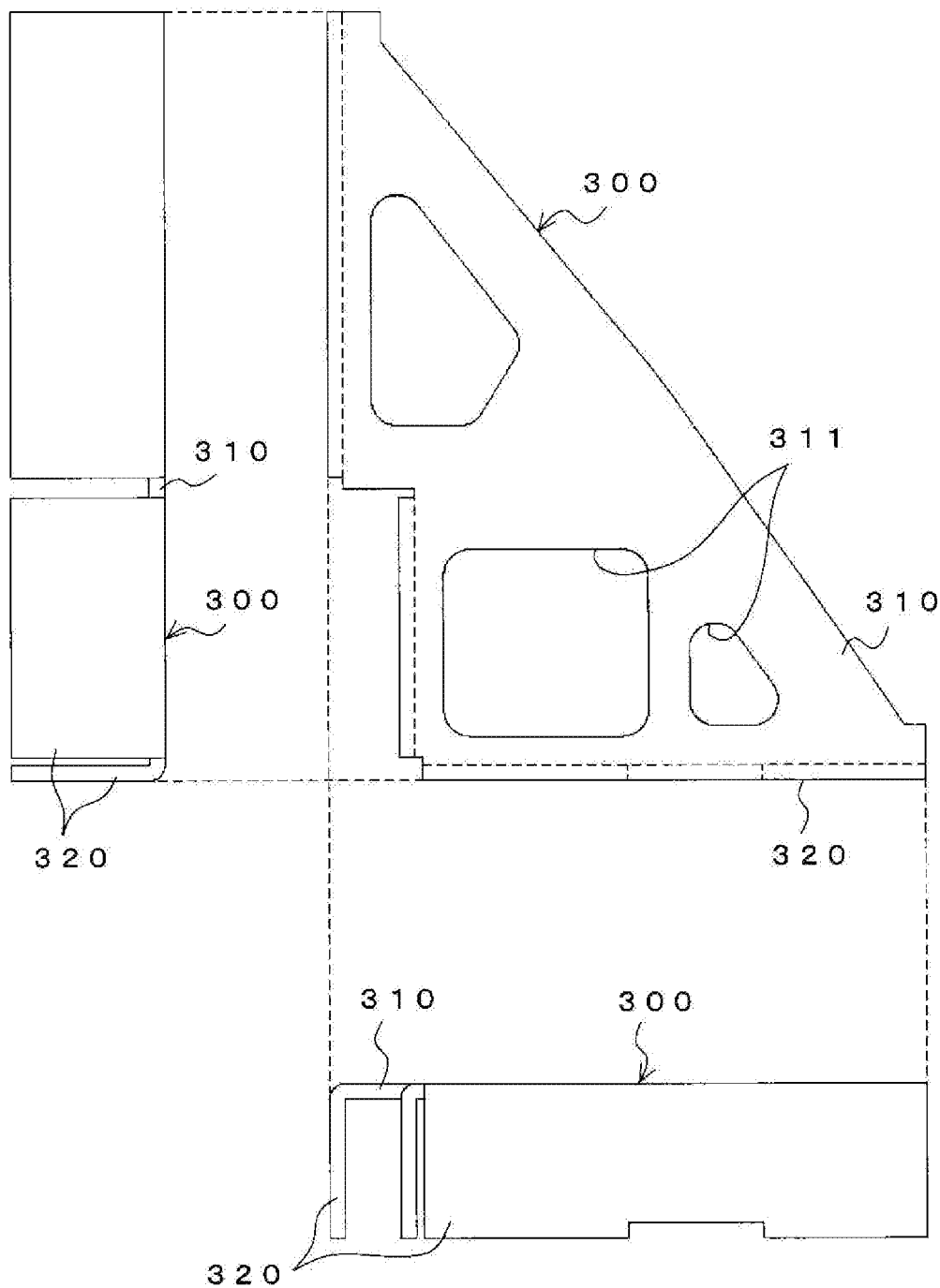
FIG. 2(b) A plan view, a left side view, and a front view showing a configuration of another partition member used in the method of manufacturing encapsulated circuit modules of the embodiment.
Figure 2C:
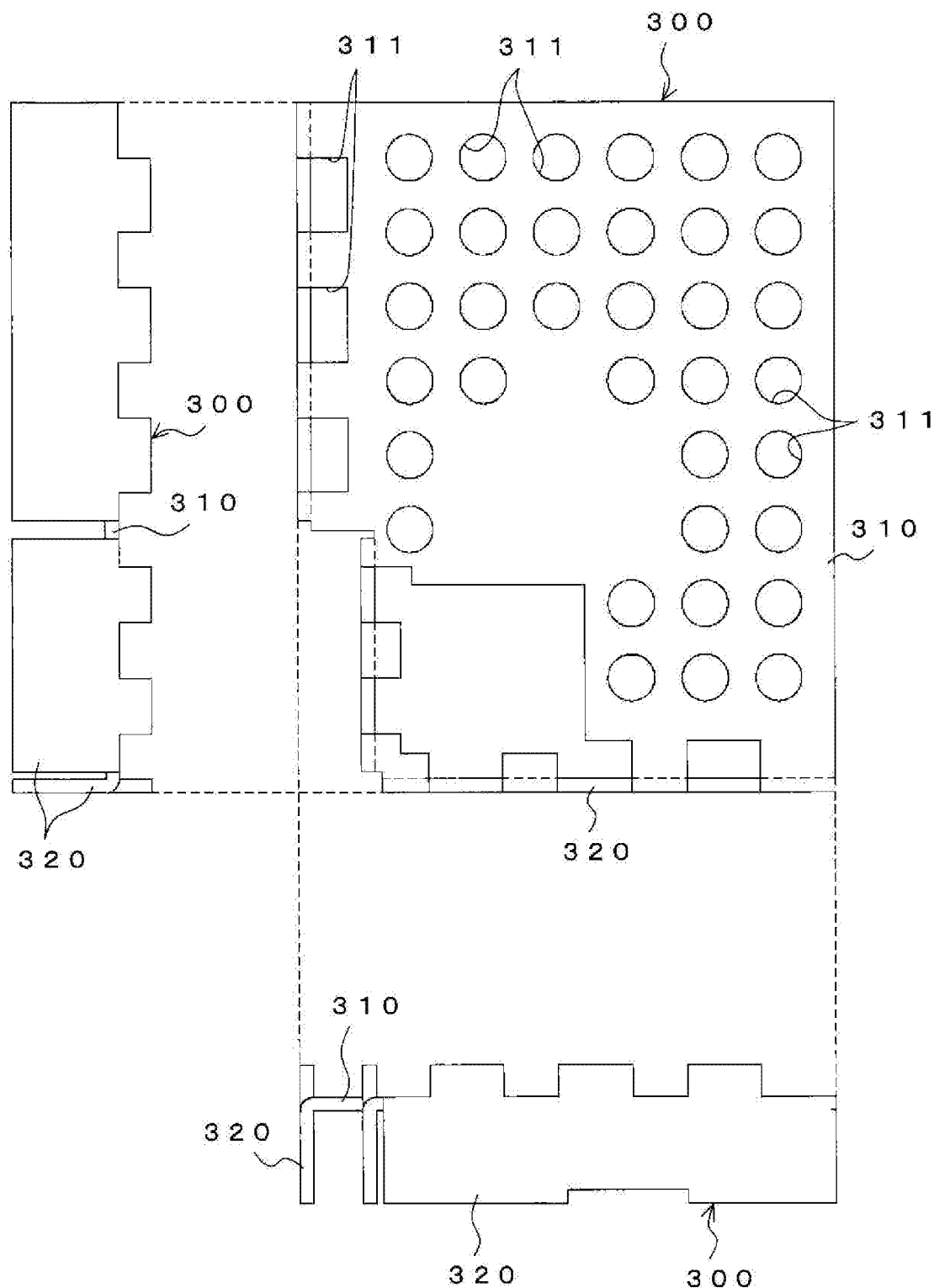
FIG. 2(c) A plan view, a left side view, and a front view showing a configuration of another partition member used in the method of manufacturing encapsulated circuit modules of the embodiment.
Figure 2D:
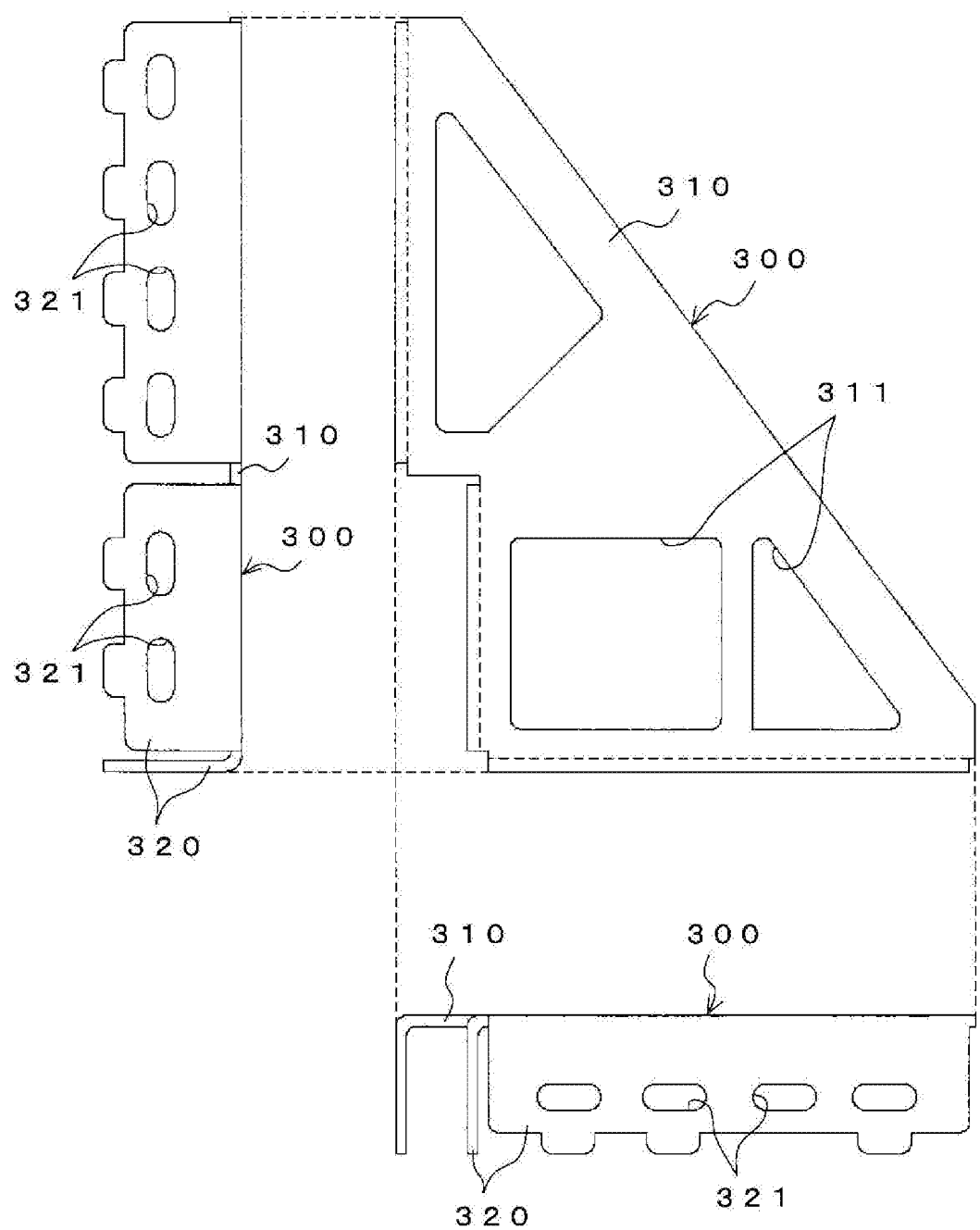
FIG. 2(d) A plan view, a left side view, and a front view showing a configuration of another partition member used in the method of manufacturing encapsulated circuit modules of the embodiment.

Other examples of the partition member 300 are shown in FIGS. 2(b), 2(c), and 2(d). In each of FIGS. 2(b), 2(c), and 2(d), illustrated are a plan view of the partition member 300, a left side view thereof on the left, and a front view thereof on the bottom. The partition member 300 shown in the figures has a roof 310, and side walls 320. The roof 310 of the partition member 300 shown in FIGS. 2(b), 2(c), and 2(d) has a plurality of roof holes 311 formed through the roof. The roof holes 311 are for allowing a first resin 400 to flow into the inward of the partition member 300 when the first resin 400 is poured, and serve to prevent separation between the partition member 300 and the first resin 400 after the resin has been cured. Furthermore, the side wall 320 of the partition member 300 shown in FIG. 2(d) has a plurality of side wall holes 321 formed through the side wall. The side wall holes 321 serve to prevent separation between the partition member 300 and the first resin 400 after the resin has been cured.

Figure 1D:
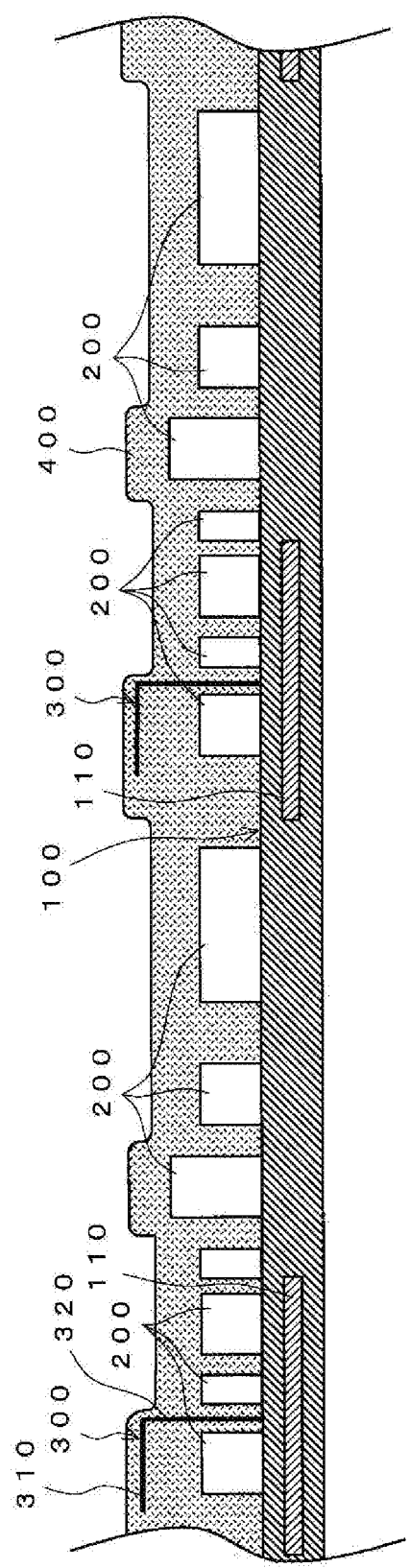
FIG. 1(d) A side cross-sectional view showing a state in which the substrate shown in FIG. 1(c) is covered with a first resin together with the components and the first resin is cured.

Next, the electronic components 200 and, if necessary, the partition member(s) 300 are attached to one surface of the substrate 100, and this surface is covered entirely with the first resin 400 together with the electronic components 200 and the partition member(s) 300. The first resin 400 is then cured (FIG. 1(d)).

To cover the entire surface of one surface of the substrate 100 with the first resin 400, although a resin encapsulation method such as molding and potting can be used, vacuum printing is used in this embodiment. With vacuum printing, it is possible to prevent any small voids from being incorporated into the first resin 400 used for encapsulation, and thus a process of removing voids from the resin can be omitted.

Vacuum printing can be performed using a known vacuum printer. An example of a known vacuum printer is a vacuum printing encapsulation system VE500 (trade mark) manufactured and sold by Toray Engineering Co., Ltd.

Figure 3:
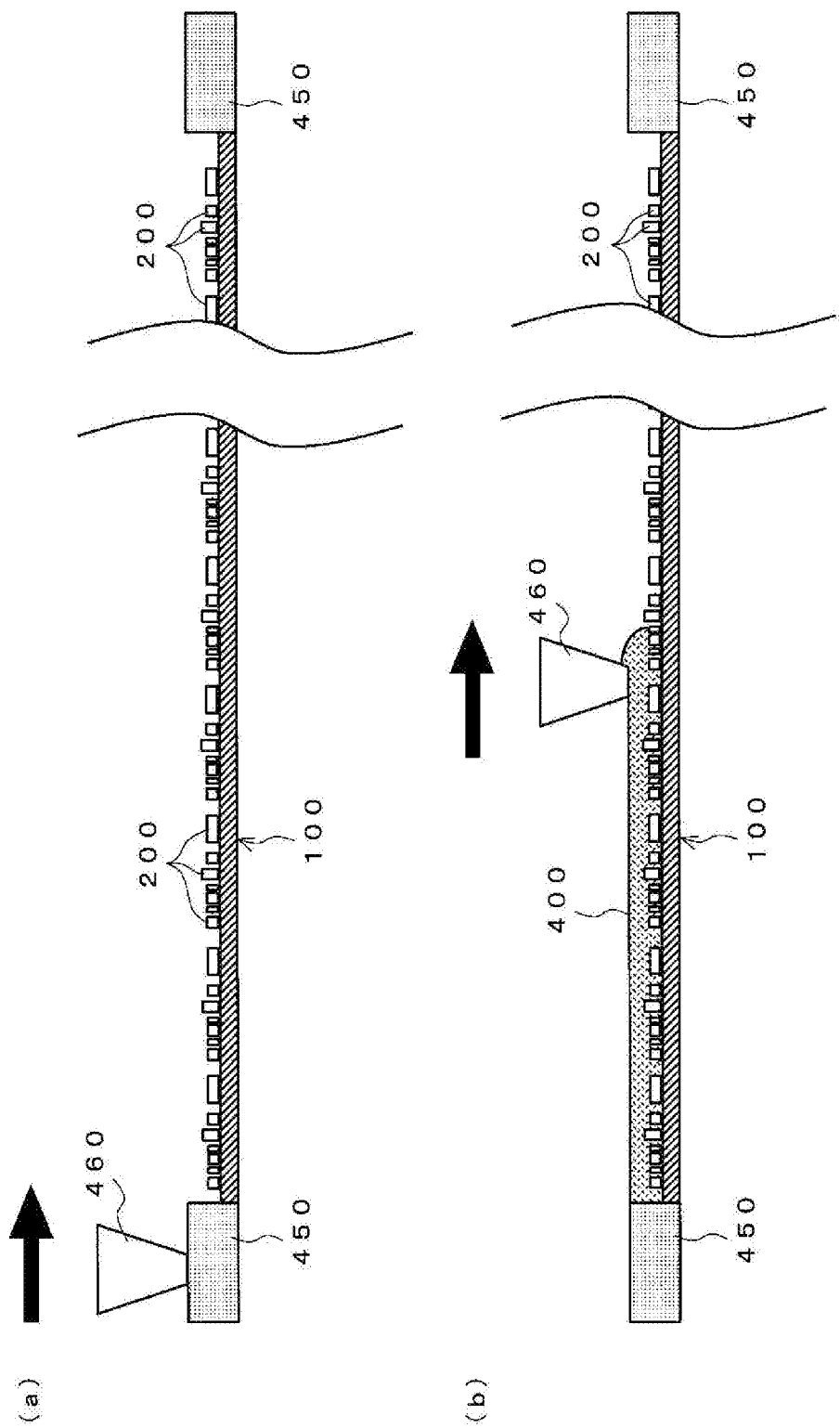
FIG. 3 A side view showing a principle of vacuum printing used in the method of manufacturing encapsulated circuit modules of the embodiment.

The principle of the vacuum printing is described briefly with reference to FIG. 3. In performing the vacuum printing, the substrate 100 is placed between, for example, metal masks 450. Then, a rod-shaped squeegee 460 of which longitudinal direction coincides with a direction perpendicular to the drawing sheet is moved from a position on the one metal mask 450 shown in FIG. 3(a) toward the other metal mask 450 in the direction depicted by an arrow (b) while supplying an uncured first resin 400. The upper surface of the first resin 400 is leveled by the lower surface of the squeegee 460 and completely covers the entire surface of the substrate 100, flowing between the electronic components 200. Vacuum printing is performed after the substrate 100, the metal masks 450 and the squeegee 460 are all placed in a vacuum chamber (not shown) where a vacuum has been established. Accordingly, no voids can be entrapped in the first resin 400. If the squeegee 460 is moved as shown in FIG. 3, the distance or height of the squeegee 460 from the substrate 100 is usually constant.

The first resin 400 covering the substrate 100 is cured by leaving it stand for an appropriate period of time.

Note that the roof 310 of the partition member 300 may have the roof holes 311 formed therethrough and the side walls 320 of the partition member 300 may have side wall holes 321 formed therethrough. The first resin 400 before curing flows into the partition member 300 through these holes.

The side wall holes 321 provided in the side walls 320 of the partition member 300 shown in FIG. 2(d) serve to strengthen a connection between the partition member 300 and the first resin 400 because the first resin 400 is cured within the side wall holes 321. If a step of scraping an upper portion of the first resin 400 as described later is performed, the roof holes 311 in the roof 310 exhibit a similar function as long as the roof 310 of the partition member 300 is left within the first resin 400.

The first resin 400 is required to have three properties, i.e., a penetrability (which is a property before being cured) to allow the first resin 400 to enter between the electronic components 200, an adhesion to the electronic components 200 as well as the substrate, and an anti-warping feature (which is a property after being cured).

In order to achieve these properties of the first resin 400, it is preferable that the first resin 400 has the following characteristics. If the first resin 400 has the following characteristics, the aforementioned requirements for the properties of the first resin before and after curing are both met.

The characteristics of the first resin 400 that are preferably achieved include a content of 80% by weight or more of filler relative to the total weight of the first resin containing the filler before being cured, and a linear expansion coefficient ($\alpha 1$) of 11 ppm/TMA or lower, a linear expansion coefficient ($\alpha 2$) of 25 ppm/TMA or lower, and a modulus of elasticity at 25° C. of 15 GPa/DMA or lower after being cured.

Examples of the first resin 400 having the aforementioned characteristics include a resin compositions (product ID: CV5385 (trade mark)) manufactured and sold by Panasonic Corporation. These resin compositions contain, for example, silica (as filler), an epoxy resin, a curing agent, and a modifier. The resin composition contains one type of resin. Therefore, the major resin component of the first resin 400 in the present application is an epoxy resin.

As described above, the first resin 400 contains filler and the aforementioned resin compositions (product ID: CV5385) contain filler. The amount of the filler contained in these resin compositions is 83% by weight, which satisfies the requirement of 80% by weight or more relative to the first resin 400. The filler is made of a material with a small linear expansion coefficient and is typically made of silica. Furthermore, in order to achieve the penetrability of the first resin 400, the particle diameter of the filler may be 30 μm or smaller. The fillers contained in the two resin compositions exemplified above both satisfy these conditions.

The resin compositions exemplified above have a linear expansion coefficient ($\alpha 1$) of 11 ppm/TMA, a linear expansion coefficient ($\alpha 2$) of 25 ppm/TMA, and a modulus of elasticity at 25° C. of 15 GPa/DMA after being cured, which satisfy the aforementioned preferable conditions.

Figure 1E:
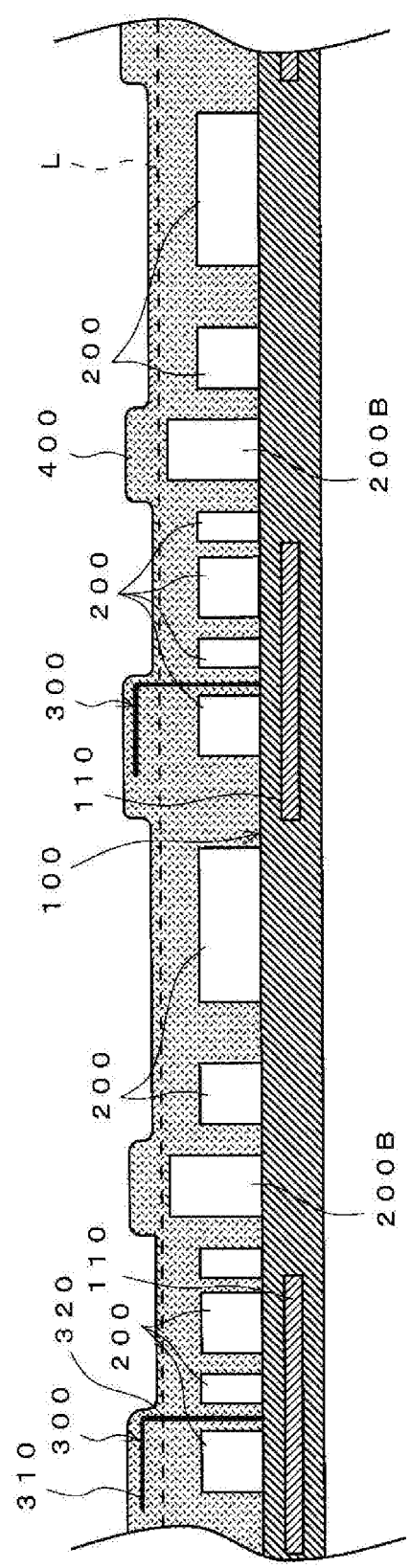
FIG. 1(e) A side cross-sectional view showing a range to be removed from the first resin shown in FIG. 1(d).
Figure 1F:
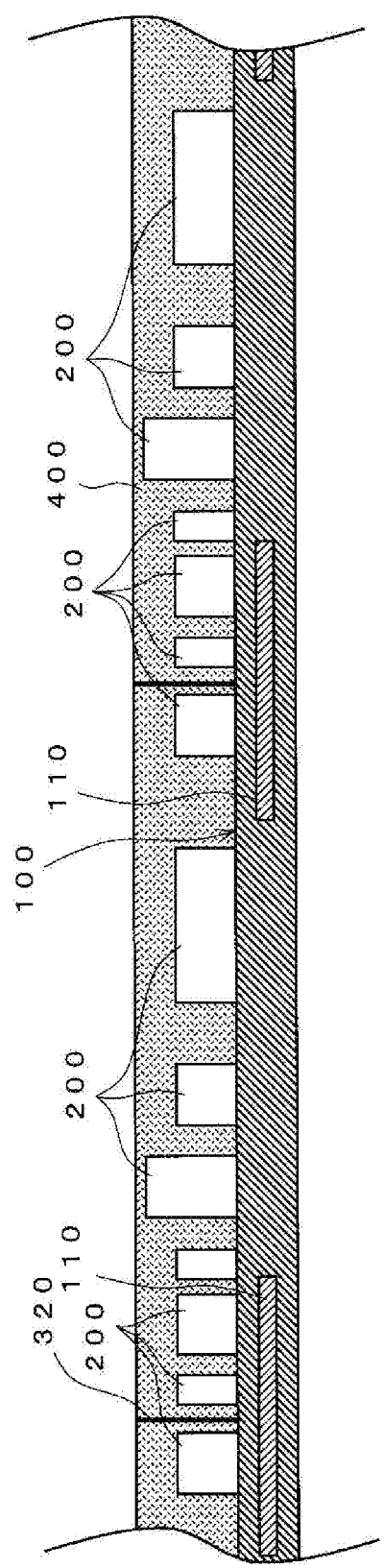
FIG. 1(f) A side cross-sectional view showing a state in which a portion of the first resin shown in FIG. 1(e) that should be removed has been removed.
Figure 1G:
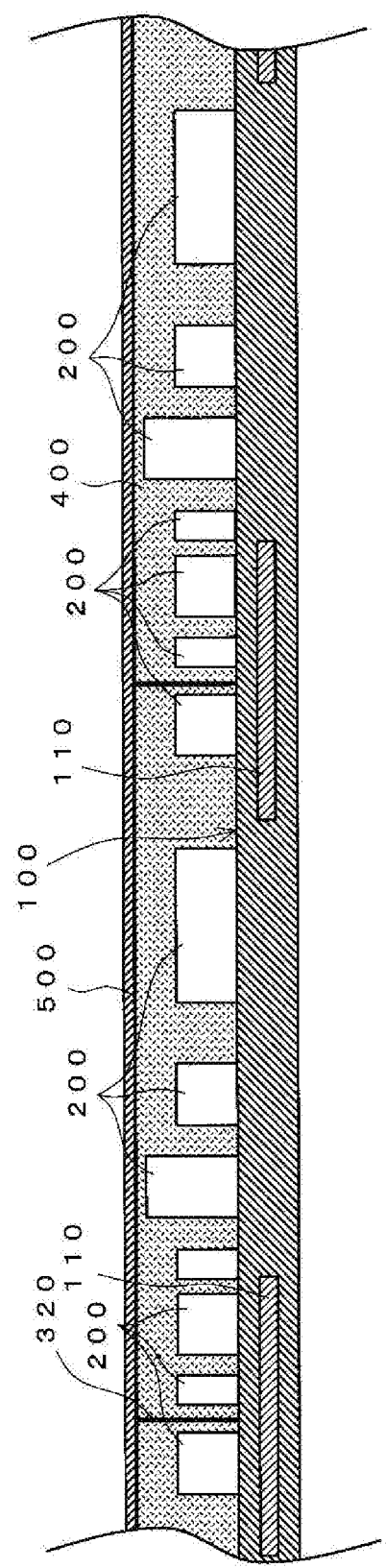
FIG. 1(g) A side cross-sectional view showing a state in which an upper surface of the first resin shown in FIG. 1(f) is covered with a second resin and the second resin is cured.
Figure 1H:
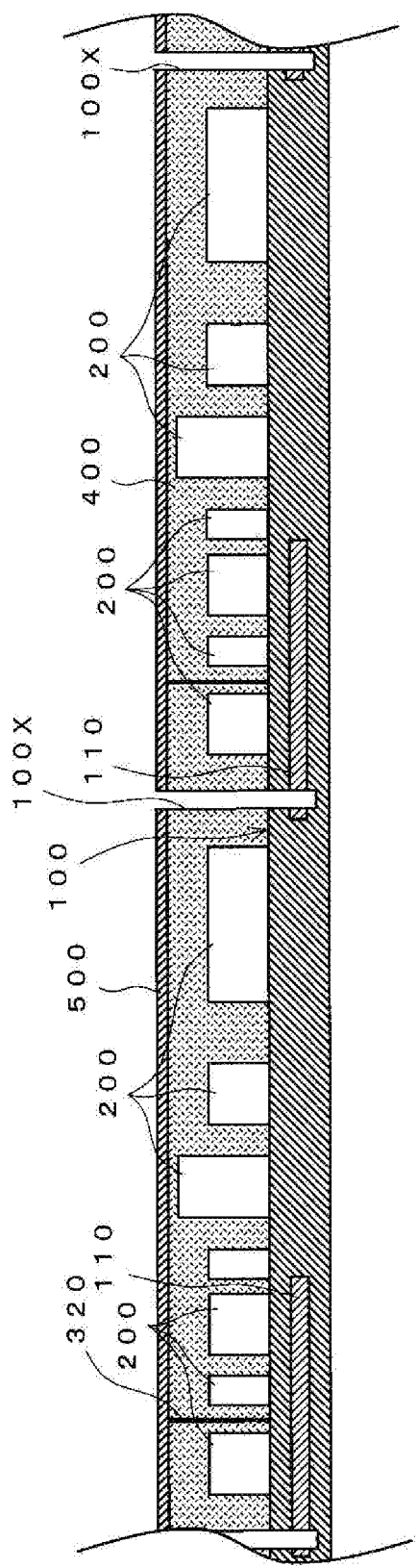
FIG. 1(h) A side cross-sectional view showing a state in which the substrate shown in FIG. 1(g) has been subjected to snicking.
Figure 1I:
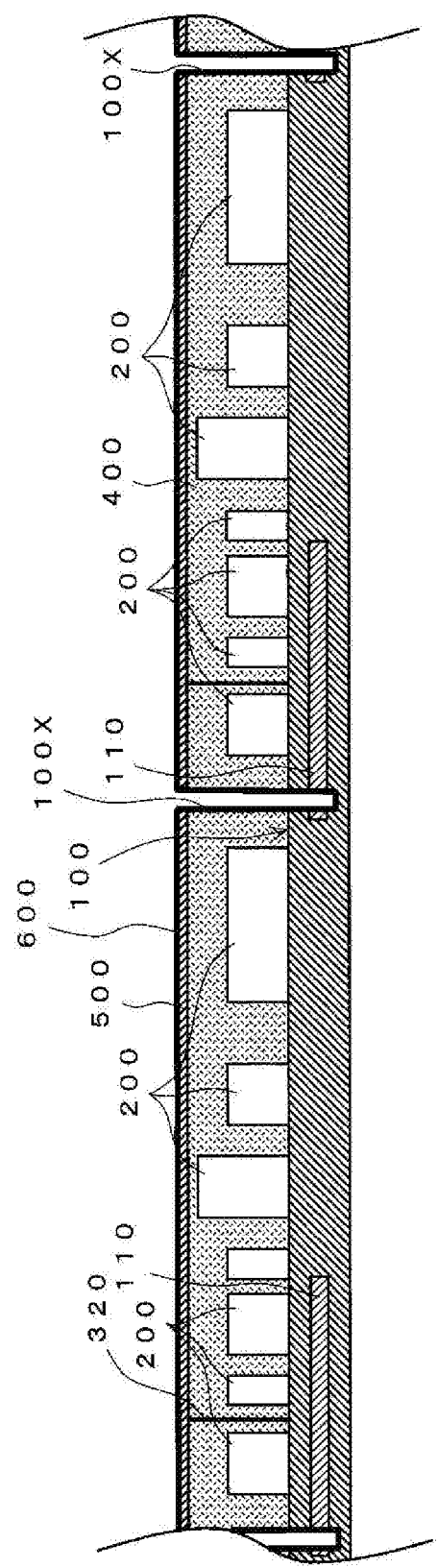
FIG. 1(i) A side cross-sectional view showing a state in which a shield layer is provided to the substrate shown in FIG. 1(h).
Figure 1I:
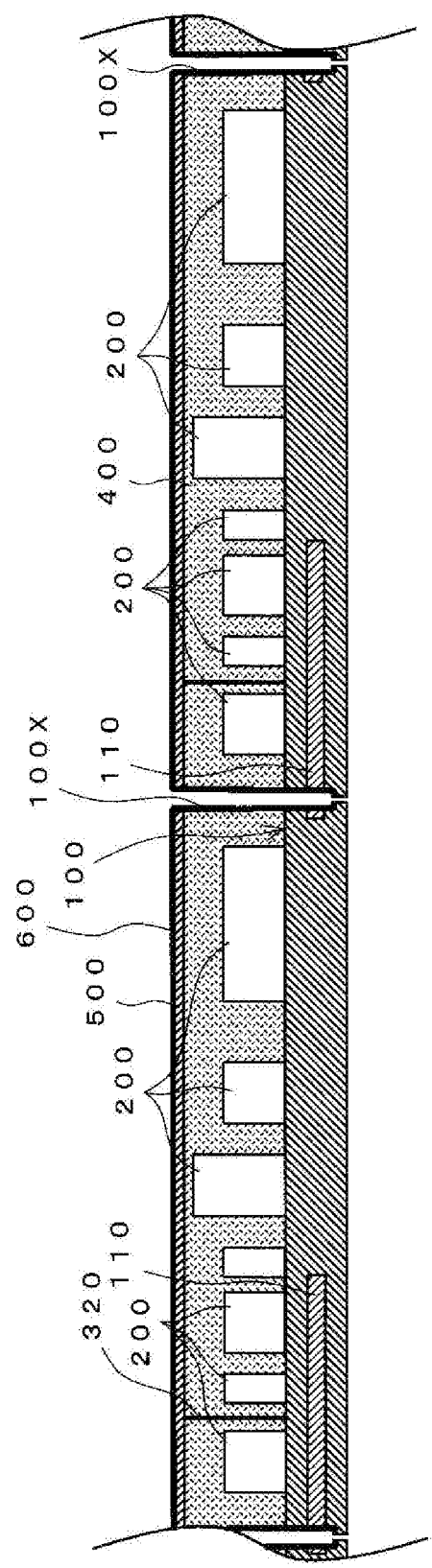

Then, although not being essential, the upper portion of the first resin 400 is removed. This is mainly for the purpose of reducing the thickness of the first resin 400 on the substrate 100, thereby reducing the thickness of the final encapsulated circuit modules. In this embodiment, a portion of the first resin 400 positioned above a position depicted by a broken line L in FIG. 1(e) is removed. The state in which the portion of the first resin 400 positioned above the broken line L has been removed is shown in FIG. 1(f).

In this embodiment, the upper surface of the first resin 400 after the removal of the portion of the first resin 400 positioned above the broken line L is parallel to the one surface of the substrate 100, but not limited thereto. The distance between the uppermost portion of an electronic component 200B which is the tallest in the electronic components 200 and the upper surface of the first resin 400 after the portion of the first resin 400 positioned above the broken line L has been removed is between 30 μm and 80 μm, but not limited thereto.

In this embodiment, when the portion of the first resin 400 positioned above the broken line L is removed, the roof 310 and a certain upper portion of the side walls 320 of the partition member 300 are also removed, but not limited thereto. Thus, only the side walls 320 of the partition member 300 are left in the first resin 400. The side walls 320 of the partition member 300 left in the first resin 400 serve as the partition for partitioning the first resin 400.

It is noted that the upper portion of the partition member 300 is not necessarily required to be removed together with the first resin 400 when the portion of the first resin 400 positioned above the broken line L is removed. In such a case, the height of the partition member 300 is designed such that the roof 310 is positioned under the broken line L.

The method of removing the portion of the first resin 400 positioned above the broken line L can be any one of known suitable techniques. For example, the first resin 400 can be removed using a cutting machine such as a milling machine or a grinding/cutting machine such as a dicing machine.

Next, the upper surface of the first resin 400 (i.e., the surface facing the substrate 100) which is parallel to the substrate 100 is covered with the second resin 500 and the second resin 500 is cured (FIG. 1(*g*)). The reason the upper surface of the first resin 400 is covered with the second resin 500 is to prevent the filler contained in the first resin 400 from falling off the first resin 400. At least a portion of the upper surface of the first resin 400 to be covered with the shield layer described later is covered with the second resin 500.

The second resin 500 does not contain filler. The material of the second resin 500 is selected such that the second resin 500 after being cured has high adhesion to the first resin 400. For example, an epoxy resin or an acrylic resin may be used as a material of the second resin 500. To increase the adhesion of the second resin 500 to the first resin 400, it is easy to use, as the second resin 500, a same type of resin as that contained in the first resin 400 as a major resin component. Since the major resin component in the first resin 400 is an epoxy resin as described above, it is possible to use an epoxy resin as the material of the second resin 500 in this embodiment. In this embodiment, the second resin 500 is an epoxy resin but not limited thereto.

It is better to reduce the thickness of the second resin 500 as much as possible to the extent that the following two conditions are satisfied. First, since the second resin 500 contributes to keeping the filler in the first resin 400, it should be thick enough to allow this. Second, the second resin 500 should be thick enough not to interfere a process of surface roughening, which can be made to a surface of the second resin 500 to improve the adhesion of metal-plating to the surface of the second resin, because an excessively thin layer of the second resin 500 can cause a problem of the surface roughening. It is better that the second resin 500 is as thin as possible to the extent that these two conditions are satisfied.

The second resin 500 in this embodiment covers the entire upper surface of the first resin 400, but not limited thereto.

The technique used to cover the upper surface of the first resin 400 with the second resin 500 can be any one of known techniques. For example, the upper surface of the first resin 400 can be covered with the second resin 500 by spray coating using a spraying device.

The second resin 500 covering the first resin 400 is cured by leaving it stand for an appropriate period of time.

Next, the surface of the second resin 500 is roughened. Roughening of the surface of the second resin 500 is for the purpose of allowing a shield layer described later deposited thereon to be adhered better and is thus performed such that this purpose is achieved. Roughening techniques for surfaces of resins are known or widely known such as etching using a strong acid or strong alkali and one of these techniques can be used to roughen the surface of the second resin.

Subsequently, the substrate 100 is subjected to snicking (FIG. 1(*h*)). This snicking is a process of forming a groove-like cut 100X through the second resin 500, through the first resin 400 and in the substrate 100.

The range where the cut 100X is formed is a range with a predetermined width across the boundary between the adjacent sections 120. The depth of the cut 100X is determined such that the cut reaches the ground electrode 110 in the substrate in this embodiment, but not limited thereto. As a result, the edge of the ground electrode 110 is exposed on the periphery of each section 120 after the snicking step. The width of the cut 100X is, for example, between 200 µm and 400 µm but not limited thereto. The width of the cut 100X is determined according to the properties of the first resin and the width of a blade of the dicing machine used for snicking.

The snicking step can be done using a known technique. For example, snicking can be done using a fully automatic dicing saw DFD641 (trade mark) manufactured and sold by DISCO Corporation equipped with a blade having an appropriate width.

Then, portions of the first resin 400, the second resin 500, and the substrate 100 which are described below are covered with a shield layer 600 (FIG. 1(*i*)).

The shield layer 600 is for protecting, when the final encapsulated circuit module is used, the electronic component(s) 200 in the encapsulated circuit module from the electromagnetic waves emitted by an electronic component or components positioned outside the encapsulated circuit module(s) or for protecting an electronic component or components positioned outside the encapsulated circuit module from the electromagnetic waves emitted by the electronic component(s) 200 in the encapsulated circuit module.

The shielding layer 600 is formed of a conductive metal suitable for shielding electromagnetic waves. The shield layer 600 may be a single layer or it may have two or more layers. If the shield layer 600 is multi-layered, the metal constituting the respective layers may be different.

Figure 4:
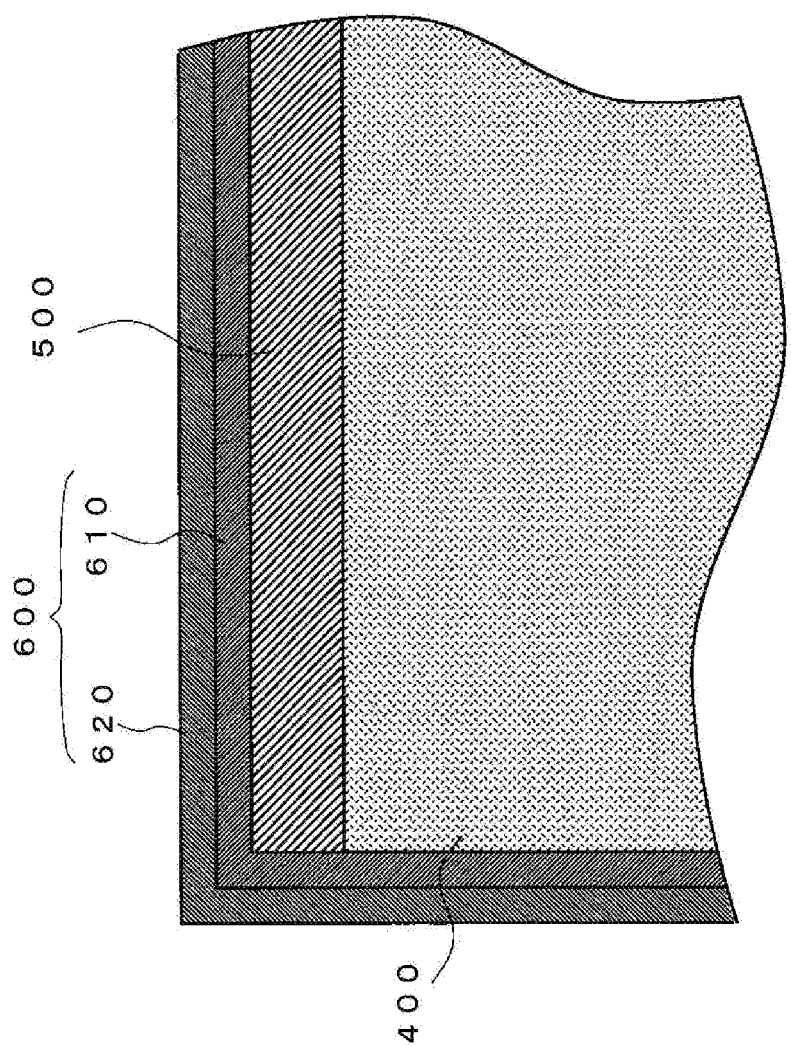
FIG. 4 A side cross-sectional view showing an example of a configuration of a shield layer obtained by the method of manufacturing encapsulated circuit modules of the embodiment.

The shield layer 600 in this embodiment has two layers, but not limited thereto. The shield layer is formed to have a two-layered structure with a first metal covering layer 610 comprising a first metal having an excellent shielding property against an electric field and a second metal covering layer 620 comprising a second metal having an excellent shielding property against a magnetic field (FIG. 4). As the first metal, for example, copper or iron can be used. As the second metal, for example, nickel can be used. In this embodiment, copper and nickel are used as the first and second metals, respectively, but not limited thereto. Either the first metal covering layer 610 or the second metal covering layer 620 may be exposed outside. The second metal covering layer 620 is exposed outside in this embodiment, but not limited thereto. This is for the purpose of avoiding deterioration of the appearance when copper is used as the first metal because it turns black as a result of natural oxidation.

The shield layer 600 is provided on the surface of the second resin 500 as well as the side surfaces of the first resin 400 and the substrate 100 which have been exposed outside by the snicking. The shield layer 600 is electrically connected with the ground electrode 110 in the substrate 100 at the side surface of the substrate 100. The shield layer 600 is also electrically connected, at the side surface of the first resin 400, with the two sides (which have been exposed on the side surface of the first resin 400 by the snicking step) of the side walls 320 of the partition member 300 constituting the partition which are opposite to their respective sides adjacent to each other. Thus, the partition member 300 will be electrically connected with the ground electrode 110 via the shield layer 600. The partition member 300, however, may have already been electrically connected with the ground electrode 110 at the lower end thereof without the shield layer 600. In such a case, the shield layer 600 can be electrically connected with the ground electrode 110 via the partition member 300 rather than the direct electrical connection between the shield layer 600 and the end surface of the ground electrode 110 at that lower end.

The shield layer 600 can be formed by applying a paste containing metal powder or metal-plating. If the shield layer 600 is a multilayer, the method of forming the individual layers may be the same or not. In this embodiment, the first metal covering layer 610 and the second metal covering layer 620 are formed using a same method.

The metal-plating may be either wet plating or dry plating. Examples of the wet plating include electroless plating. Examples of the dry plating include physical vapor deposition (PVD) and chemical vapor deposition (CVD). Examples of the former include sputtering and vacuum vapor deposition and examples of the latter include thermal CVD and photo CVD.

Of these, in consideration of costs and its capability of reducing residual stress in the shield layer 600, wet plating should be selected. Furthermore, the wet plating can provide a thicker shield layer 600 which specifically ranges from several micrometers to several tens micrometers. It is thus easy to provide a sufficient thickness for shielding electromagnetic waves. Although wet plating includes electrolytic plating and electroless plating, it is preferable to use electroless plating in consideration of possible damages of the electronic components in the encapsulated circuit modules to be processed, because the electroless plating does not require any flow of electrical current through surfaces of the encapsulated circuit modules.

The first metal covering layer 610 and the second metal covering layer 620 in this embodiment are both formed by electroless plating, but not limited thereto.

Finally, the substrate 100 is snipped into separate sections 120 along the cut 100X made by the snicking step (FIG. 1(*j*)).

The snipping step can be done using a known technique. For example, snipping can be done using the aforementioned fully automatic dicing saw DFD641 (trade mark) equipped with a blade having an appropriate width.

As a result, the encapsulated circuit modules corresponding to the sections of the substrate 100 can be obtained.

Figure 5:
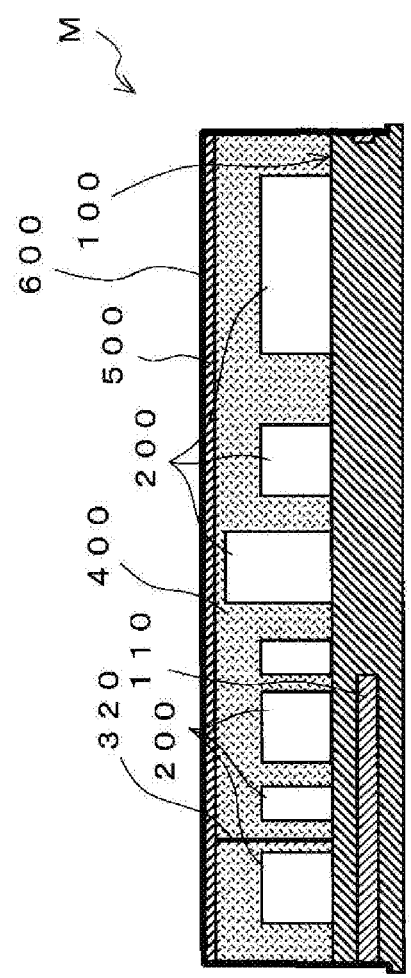
FIG. 5 A side cross-sectional view of an encapsulated circuit module obtained by the method of manufacturing encapsulated circuit modules according to the embodiment.
Figure 7A:
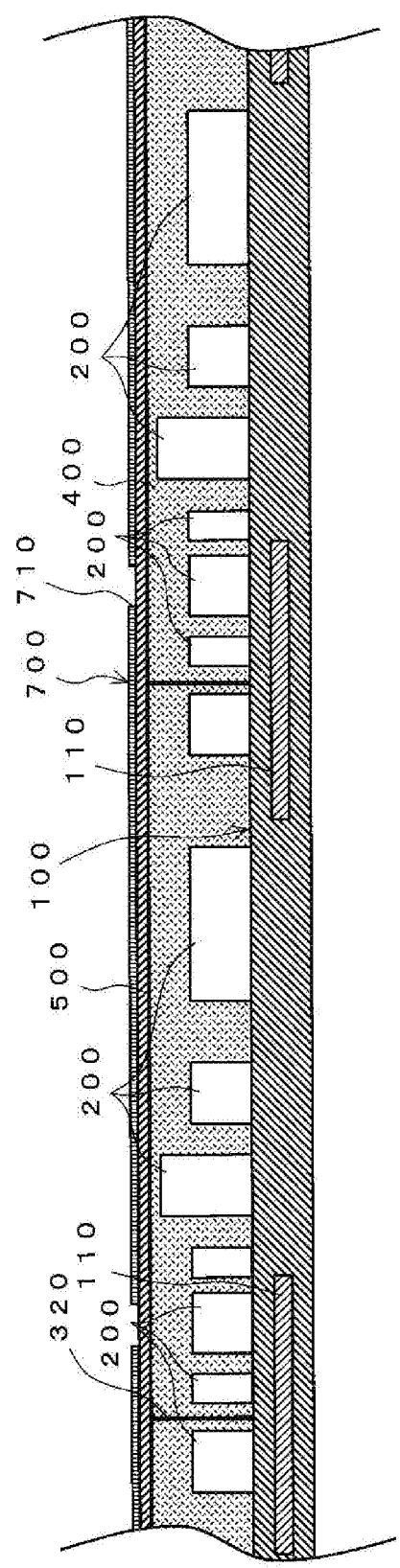
FIG. 7(a) A side cross-sectional view showing a state in which a mask is overlaid on a second resin in a method of manufacturing encapsulated circuit modules of a modified version 1.
Figure 7B:
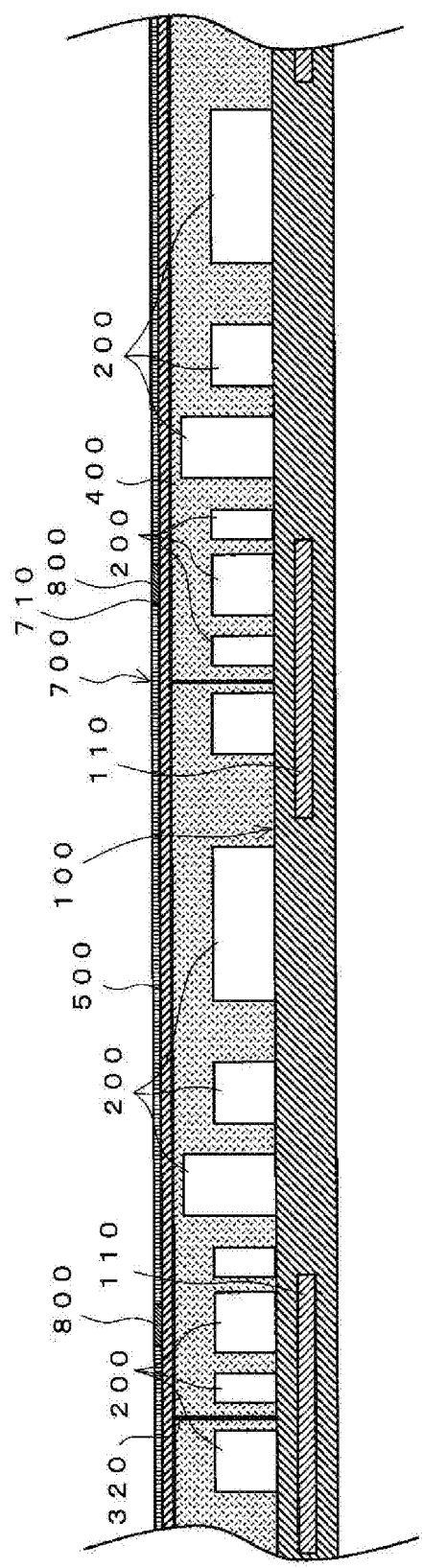
FIG. 7(b) A side cross-sectional view showing a state in which a resist for plating has been applied to the mask shown in FIG. 7(a).
Figure 7C:
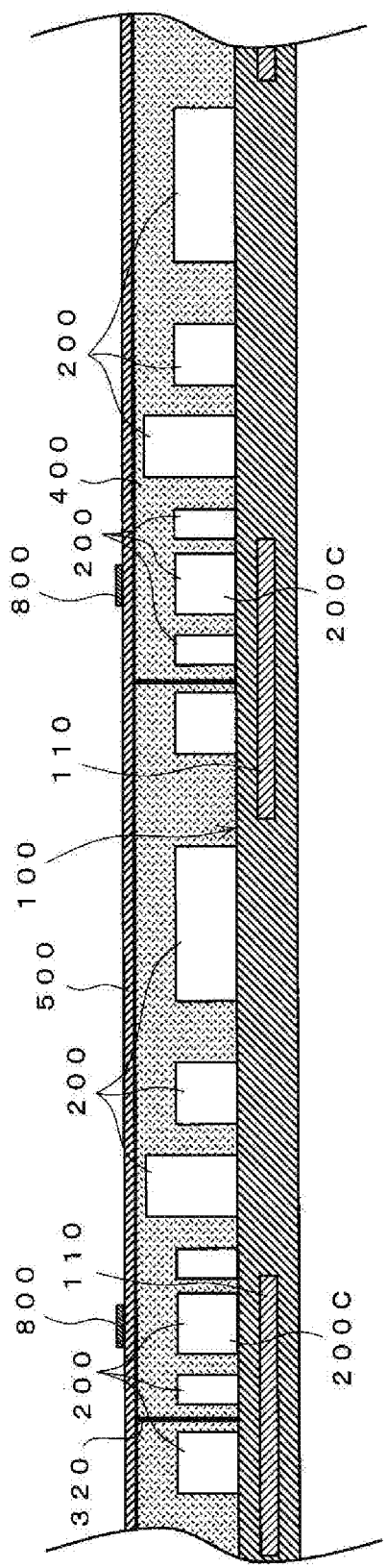
FIG. 7(c) A side cross-sectional view showing a state in which the mask shown in FIG. 7(b) has been removed.
Figure 7D:
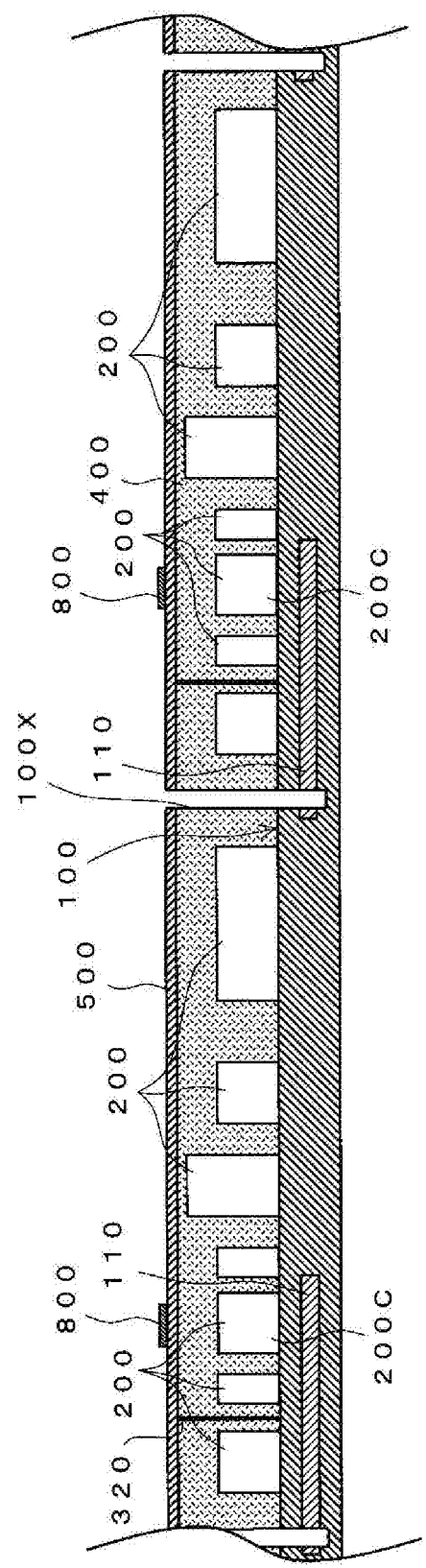
FIG. 7(d) A side cross-sectional view showing a state of the substrate shown in FIG. 7(c) which has been subjected to snicking.
Figure 7E:
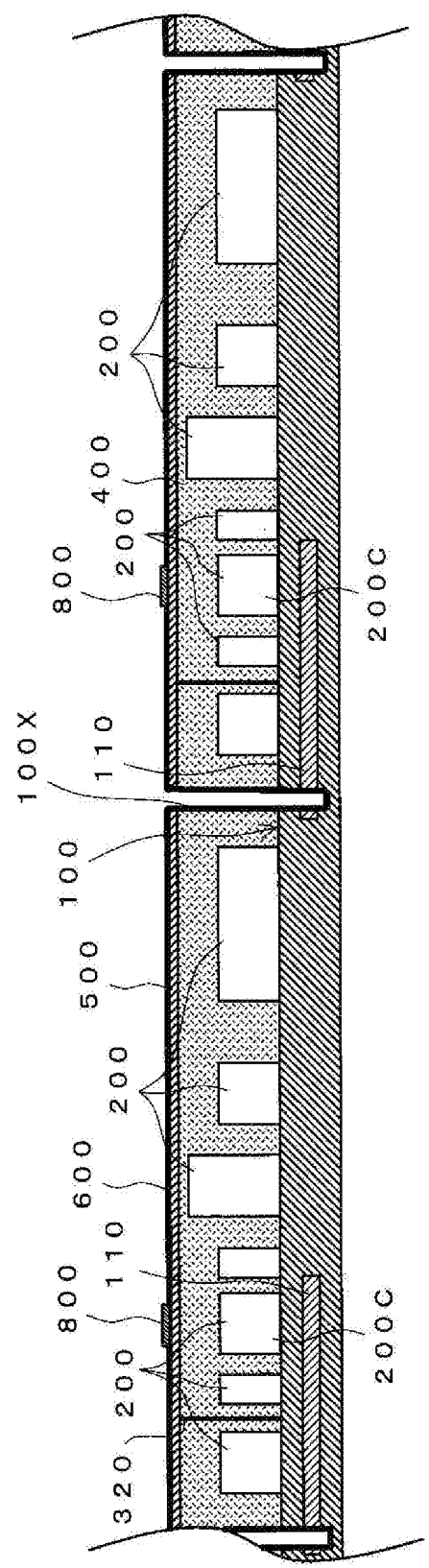
FIG. 7(e) A side cross-sectional view showing a state in which a shield layer is provided onto the substrate shown in FIG. 7(d).
Figure 7F:
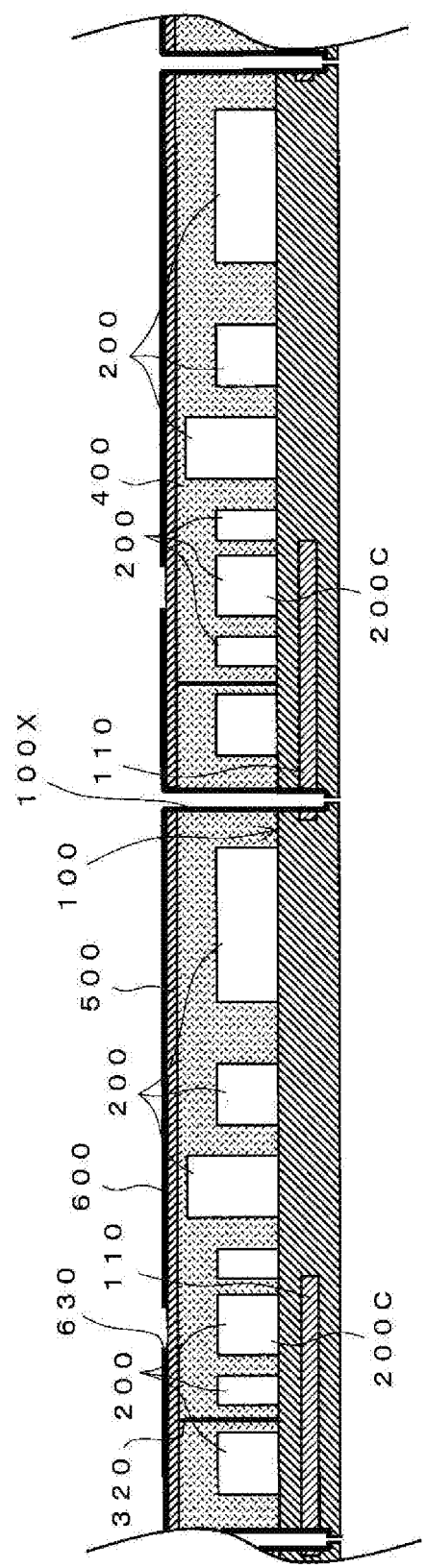
FIG. 7(f) A side cross-sectional view showing a state in which the substrate shown in FIG. 7(e) has been subjected to snipping and removal of the resist for plating.
Figure 8A:
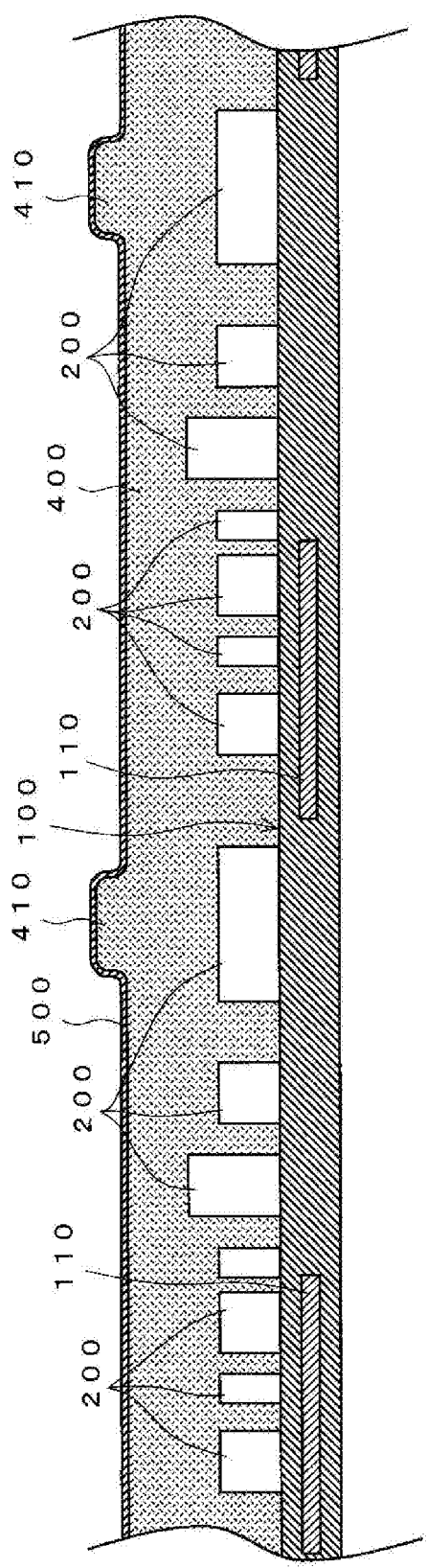
FIG. 8(a) A side cross-sectional view showing a state in which an upper surface of a first resin is covered with a second resin and the second resin is cured in a method of manufacturing encapsulated circuit modules of a modified version 2.
Figure 8B:
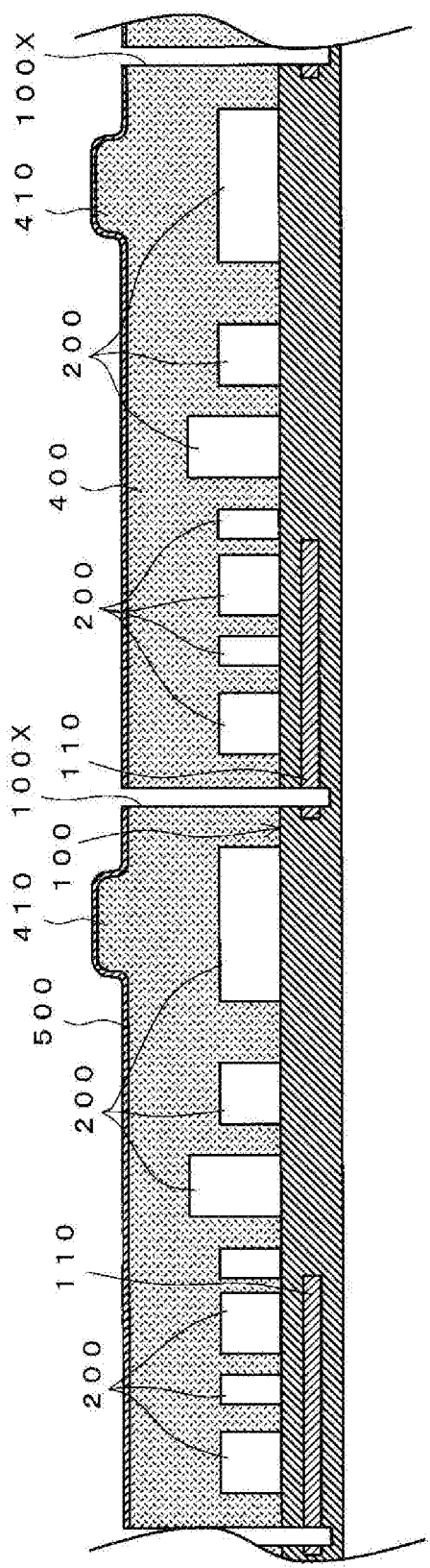
FIG. 8(b) A side cross-sectional view showing a state of the substrate shown in FIG. 8(a) which has been subjected to snicking.
Figure 8C:
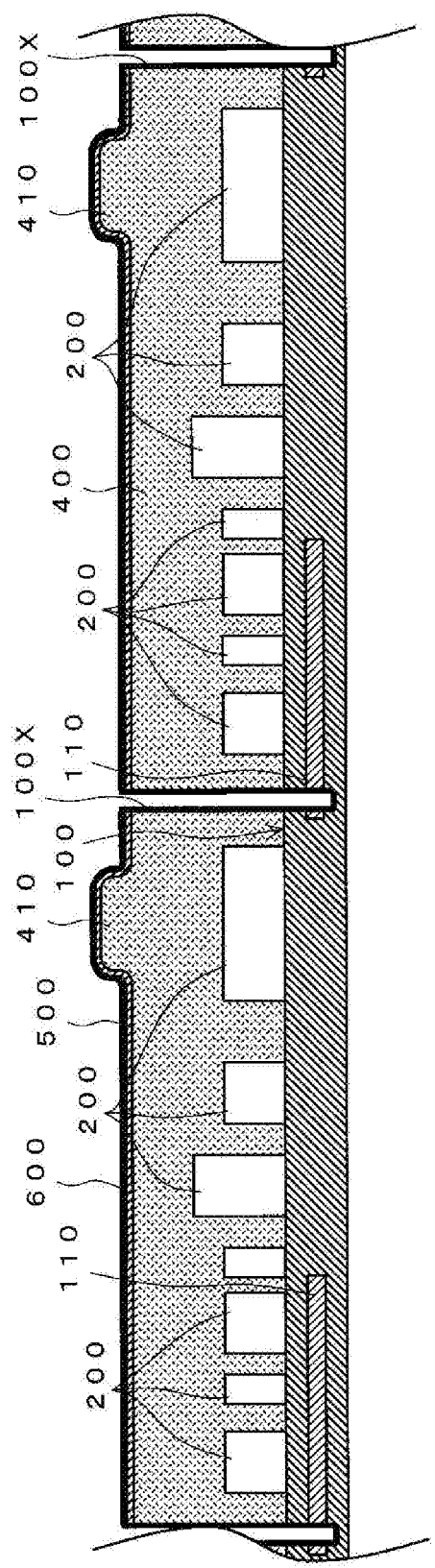
FIG. 8(c) A side cross-sectional view showing a state in which a shield layer is provided onto the substrate shown in FIG. 8(b).
Figure 8D:
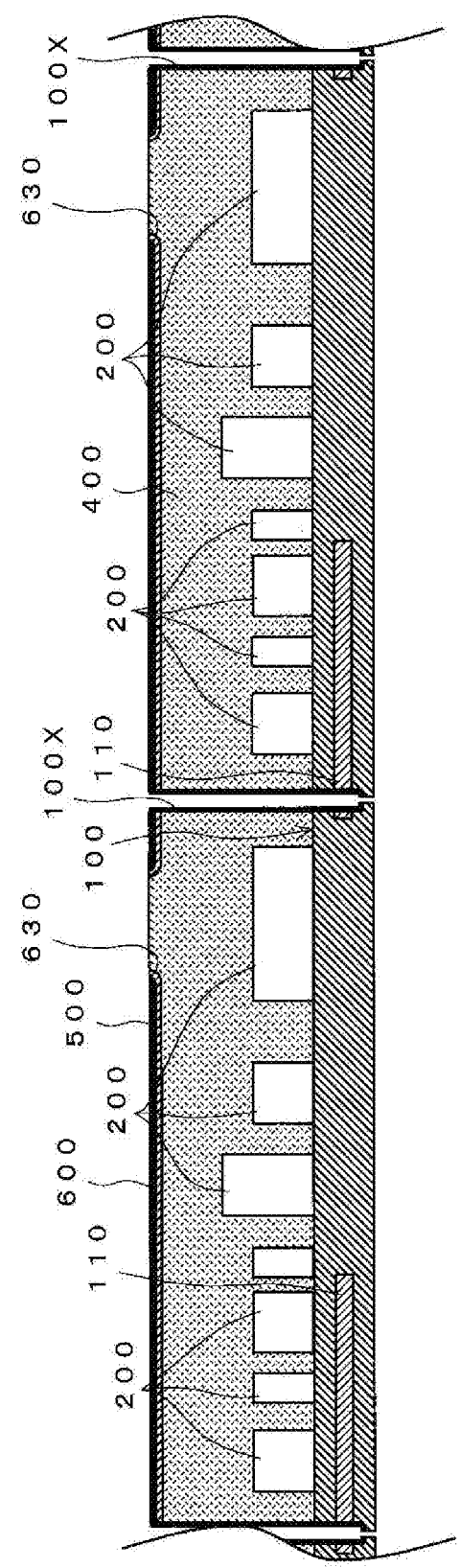
FIG. 8(d) A side cross-sectional view showing a state in which raises on the substrate shown in FIG. 8(c) have been removed and the substrate has been subjected to snipping.

A cross-sectional view of an encapsulated circuit module M obtained using the aforementioned method is shown in FIG. 5 and a perspective plan view of the encapsulated circuit module M in shown in FIG. 6.

As shown in FIG. 5, the substrate 100 of the encapsulated circuit module M is covered with the first resin 400 together with the electronic components 200. The upper surface of the first resin 400 is covered with the second resin 500. Furthermore, the upper surface of the second resin 500, the side surfaces of the first resin 400 and the second resin 500, and the side surface of the substrate 100 exposed by the snicking are covered with the shield layer 600. The shield layer 600 includes a first metal covering layer 610 and the second metal covering layer 620 as described above, which are electrically connected with the side surface of the ground electrode 110 in the substrate 100 as shown in FIG. 5. With the second resin 500, the portion of the shield layer 600 that covers the first resin 400 with the second resin 500 being interposed between them does not have a problem of falling off which otherwise can occur due to the falling off of the filler from the first resin 400. Although the portion of the shield layer 600 that covers the side surface of the first resin 400 covers the first resin 400 without the interposed second resin, the shield layer 600 adheres to the first resin 400 well because the side surface of the first resin 400 is rather roughened as a result of the snicking step and thus is not likely to be separated from the side surface of the first resin.

Furthermore, as shown in FIG. 6, the shield layer 600 is electrically connected, at the side surface of the first resin 400, with the two sides of the side walls 320 of the partition member 300 constituting the partition which are opposite to their sides adjacent to each other.

The electronic component 200A is protected by the side walls 320 on two sides thereof, by the shield layer 600 on two sides thereof, and by the shield layer 600 on the upper surface thereof.

Next, modified versions of the method of manufacturing encapsulated circuit modules according to the above embodiment are described.

<Modified Version 1>

A method of manufacturing encapsulated circuit modules according to the modified version 1 is generally identical to the one described in the above embodiment. Specifically, it is completely the same as the aforementioned embodiment before the process of covering the upper surface of the first resin 400 with the second resin 500 and curing the latter described with reference to FIG. 1(*g*).

The difference between the method of manufacturing encapsulated circuit modules according to the modified version 1 and the aforementioned embodiment lies in the fact that the shield layer 600 on the upper surface of the encapsulated circuit module manufactured has an opening. To provide an opening at a portion of the shield layer 600 is required in, for example, the following cases.

If the electronic component 200 is, for example, a transceiver, the electronic component 200 must communicate with an external electronic component using, for example, radio waves. In such a case, the shield layer 600 that cuts off the electromagnetic waves could interfere with the communication using radio waves. In consideration of this, an area without the shield layer 600 is provided as an opening of the shield layer 600 in an area required for such communication, e.g., directly above the electronic component 200 that performs communication. This allows the electronic component 200 in the encapsulated circuit module which performs communication to communicate while protecting other electronic component(s) by the shield layer 600.

As described above, to make an opening in the shield layer 600 depending on the situation is the feature of the method of manufacturing encapsulated circuit modules according to the modified version 1.

In the method of manufacturing encapsulated circuit modules according to the modified version 1, after the process shown in FIG. 1(*g*), a mask 700 is laid over the surface of the second resin 500 (FIG. 7(*a*)). The mask 700 is a mold for forming a layer by resist for plating described later. The mask 700 may be a known one, but the mask 700 has a sheet-like shape. In addition, a mask opening 710 is provided at a position where the layer by the resist for plating is to be formed. In this modified version 1, one mask opening is provided in each section 120 at the same position among all sections 120.

Then, a resist for plating 800 is applied to the top of the mask 700 (FIG. 7(*b*)). The resist for plating 800 is made of a material that can prevent the shield layer 600 from being formed on the surface thereof. The resist for plating 800 in this embodiment is made of a material that can prevent the metal from being adhered to the surface thereof when metal plating, more specifically, electroless plating is performed. Since the resist for plating is well known, description thereof will be omitted.

The resist for plating 800 is adhered to the surface of the second resin 500 at positions corresponding to the mask openings 710 and is not adhered to the surface of the second resin 500 where covered with the mask 700.

Next, the mask 700 is removed (FIG. 7(*c*)). Then, the layers of the resist for plating 800 are left at appropriate positions on the surface of the second resin 500. For example, an electronic component 200C directly under the position where the resist for plating 800 is present may be the electronic component 200 such as the aforementioned transceiver over which it is preferable that the shield layer 600 is not present.

Subsequently, in a manner similar to that described in the aforementioned embodiment, the snicking step is performed (FIG. 7(*d*)).

Then, in a manner similar to that described in the aforementioned embodiment, the shield layer 600 having a two-layered structure as described in the above embodiment is formed (FIG. 7(*e*)). The shield layer 600 is formed at positions where no layer of the resist for plating 800 is present, and is not formed where the layer of the resist for plating 800 is present.

Next, by removing the resist for plating 800 and performing the snipping step similar to the one described in the above embodiments, the encapsulated circuit modules each having the opening 630 at a desired position in the shield layer 600 are completed (FIG. 7(*f*)).

<Modified Version 2>

A method of manufacturing encapsulated circuit modules according to a modified version 2 is a method of manufacturing encapsulated circuit modules with the shield layer 600 having an opening is provided on the upper surface thereof, as in the case of the method of manufacturing encapsulated circuit modules according to the modified version 1.

The method of manufacturing encapsulated circuit modules according to the modified version 2 is generally identical to the one described in the above embodiment. Specifically, it is almost identical to the aforementioned embodiment before the process of covering the upper surface of the first resin 400 with the second resin 500 and curing the latter described with reference to FIG. 1(*g*). The differences between the method of manufacturing encapsulated circuit modules according to the modified version 2 and that of the aforementioned embodiment in the process so far lie in the facts that no partition member 300 is used in the method of manufacturing encapsulated circuit modules according to the modified version 2 and that raises 410 with a larger height from the substrate 100 than their surroundings are formed at appropriate positions on the first resin 400 when the substrate 100 and the electronic components 200 are covered with the first resin 400 and the process of scraping the upper portion of the first resin 400 as described with reference to FIG. 1(*e*) is omitted, in the method of manufacturing encapsulated circuit modules according to the modified version 2 (FIG. 8(*a*)). Openings in the shield layer described later will be formed at positions where the raises 410 are present in the modified version 2. In other words, the raises 410 are formed at positions where the openings are desired to be formed in the shield layer.

Next, the snicking step is performed in a manner similar to the one described in the aforementioned embodiment (FIG. 8(*b*)).

Then, the shield layer 600 having a two-layered structure that is similar to the one described in the aforementioned embodiment is formed in a manner similar to the one described in the aforementioned embodiment (FIG. 8(*c*)).

Subsequently, the raises 410 are removed together with the second resin 500 covering the raises 410 and the shield layer 600 covering the second resin 500 covering the raises 410. In this embodiment, the aforementioned portions are removed by leveling the positions where the raises 410 are present with the surface of the shield layer 600 covering the surroundings of the raises 410 with the second resin 500 interposed therebetween, but not limited thereto. The snipping step similar to the one described in the aforementioned embodiment is performed and the encapsulated circuit modules each having an opening 630 at a desired position in the shield layer 600 are completed (FIG. 8(*d*)).

REFERENCE SIGNS LIST

100 substrate
100X cut
110 ground electrode
120 section
200 electronic component
300 partition member
310 roof
320 side wall
400 first resin
410 raise
500 second resin
600 shield layer
630 opening
700 mask
800 resist for plating

The invention claimed is:

1. A method of manufacturing encapsulated circuit modules comprising:

a first covering step for entirely covering a surface of a substrate with a first resin containing filler together with electronic components and curing the first resin, the surface of the substrate having a plurality of contiguous assumed sections, each of the sections having at least one of the electronic components mounted thereon, the substrate having a ground electrode;

after the first covering step, a first resin shaping step for scraping a surface of the cured first resin such that the surface of the cured first resin becomes parallel to the surface of the substrate;

a second covering step for covering a surface of the first resin covering the substrate with a second resin containing no filler and curing the second resin, wherein the second covering step is performed to the surface of the first resin generated by the first resin shaping step;

a snicking step for removing a predetermined width of the second resin, the first resin and the substrate to a predetermined depth of the substrate, the predetermined width including a boundary between adjacent assumed sections;

a shield layer-forming step for forming a metal shield layer on a surface of the second resin and side surfaces of the second resin, the first resin and the substrate exposed by the snicking step, by applying a paste containing metal powder or metal-plating, the shield layer being electrically connected with the ground electrode; and a snipping step for separating the sections by cutting the substrate along the boundaries between the sections to obtain a plurality of the encapsulated circuit modules corresponding to the sections.

2. The method of manufacturing encapsulated circuit modules according to claim 1, wherein a same type of resin as that contained as a major resin component in the first resin is used as the second resin.

3. The method of manufacturing encapsulated circuit modules according to claim 2, wherein the resin contained in the first resin as the major resin component is an epoxy resin and the second resin is an epoxy resin.

4. The method of manufacturing encapsulated circuit modules according to claim 1, wherein the shield layer is formed as comprising a first metal layer and a second metal layer, the first metal layer comprising a first metal having a shielding property against an electric field, and the second metal layer comprising a second metal having a shielding property against a magnetic field.

5. The method of manufacturing encapsulated circuit modules according to claim 4, wherein copper or iron is used as the first metal.

6. The method of manufacturing encapsulated circuit modules according to claim 5, wherein nickel is used as the second metal.

7. The method of manufacturing encapsulated circuit modules according to claim 4, wherein nickel is used as the second metal.

8. A method of manufacturing encapsulated circuit modules comprising:
   a first covering step for entirely covering a surface of a substrate with a first resin containing filler together with electronic components and curing the first resin, the surface of the substrate having a plurality of contiguous assumed sections, each of the sections having at least one of the electronic components mounted thereon, the substrate having a ground electrode,
   wherein the surface of the substrate is entirely covered with the first resin containing the filler together with the electronic components using a vacuum printing technique in the first covering step;
   a second covering step for covering a surface of the first resin covering the substrate with a second resin containing no filler and curing the second resin;
   a snicking step for removing a predetermined width of the second resin, the first resin and the substrate to a predetermined depth of the substrate, the predetermined width including a boundary between adjacent assumed sections;
   a shield layer-forming step for forming a metal shield layer on a surface of the second resin and side surfaces of the second resin, the first resin and the substrate exposed by the snicking step, by applying a paste containing metal powder or metal-plating, the shield layer being electrically connected with the ground electrode; and
   a snipping step for separating the sections by cutting the substrate along the boundaries between the sections to obtain a plurality of the encapsulated circuit modules corresponding to the sections.

9. The method of manufacturing encapsulated circuit modules according to claim 8, wherein a resin containing the filler at an amount of 80% by weight or more relative to the total weight of the first resin containing the filler before being cured and having a linear expansion coefficient ($\alpha 1$) of 11 ppm/TMA or lower, a linear expansion coefficient ($\alpha 2$) of 25 ppm/TMA or lower, and a modulus of elasticity at 25° C. of 15 GPa/DMA or lower after being cured is used as the first resin.

10. The method of manufacturing encapsulated circuit modules according to claim 8, wherein a same type of resin as that contained as a major resin component in the first resin is used as the second resin.

11. The method of manufacturing encapsulated circuit modules according to claim 10, wherein the resin contained in the first resin as the major resin component is an epoxy resin and the second resin is an epoxy resin.

12. The method of manufacturing encapsulated circuit modules according to claim 8, wherein the shield layer is formed as comprising a first metal layer and a second metal layer, the first metal layer comprising a first metal having a shielding property against an electric field, and the second metal layer comprising a second metal having a shielding property against a magnetic field.

13. The method of manufacturing encapsulated circuit modules according to claim 12, wherein copper or iron is used as the first metal and/or wherein nickel is used as the second metal.

14. A method of manufacturing encapsulated circuit modules comprising:
   a first covering step for entirely covering a surface of a substrate with a first resin containing filler together with electronic components and curing the first resin, the surface of the substrate having a plurality of contiguous assumed sections, each of the sections having at least one of the electronic components mounted thereon, the substrate having a ground electrode,
   wherein a resin containing the filler at an amount of 80% by weight or more relative to the total weight of the first resin containing the filler before being cured and having a linear expansion coefficient ($\alpha 1$) of 11 ppm/TMA or lower, a linear expansion coefficient ($\alpha 2$) of 25 ppm/TMA or lower, and a modulus of elasticity at 25° C. of 15 GPa/DMA or lower after being cured is used as the first resin;
   a second covering step for covering a surface of the first resin covering the substrate with a second resin containing no filler and curing the second resin;
   a snicking step for removing a predetermined width of the second resin, the first resin and the substrate to a predetermined depth of the substrate, the predetermined width including a boundary between adjacent assumed sections;
   a shield layer-forming step for forming a metal shield layer on a surface of the second resin and side surfaces of the second resin, the first resin and the substrate exposed by the snicking step, by applying a paste containing metal powder or metal-plating, the shield layer being electrically connected with the ground electrode; and
   a snipping step for separating the sections by cutting the substrate along the boundaries between the sections to obtain a plurality of the encapsulated circuit modules corresponding to the sections.

15. The method of manufacturing encapsulated circuit modules according to claim 14, wherein a same type of resin as that contained as a major resin component in the first resin is used as the second resin.

16. The method of manufacturing encapsulated circuit modules according to claim 15, wherein the resin contained in the first resin as the major resin component is an epoxy resin and the second resin is an epoxy resin.

17. The method of manufacturing encapsulated circuit modules according to claim 14, wherein the shield layer is formed as comprising a first metal layer and a second metal layer, the first metal layer comprising a first metal having a shielding property against an electric field, and the second metal layer comprising a second metal having a shielding property against a magnetic field.

18. The method of manufacturing encapsulated circuit modules according to claim 17, wherein copper or iron is used as the first metal and/or wherein nickel is used as the second metal.

19. An encapsulated circuit module comprising:
a substrate having a ground electrode;
at least one electronic component mounted on a surface of the substrate;
a first resin layer comprising a first resin containing filler, the first resin layer covering the surface of the substrate together with the electronic component,
wherein the first resin containing filler comprises a resin containing the filler at an amount of 80% by weight or more relative to the total weight of the first resin containing the filler before being cured and having a linear expansion coefficient ($\alpha 1$) of 11 ppm/TMA or lower, a linear expansion coefficient ($\alpha 2$) of 25 ppm/TMA or lower, and a modulus of elasticity at 25° C. of 15 GPa/DMA or lower after being cured;
a second resin layer comprising a second resin containing no filler, the second resin layer covering the surface of the first resin layer; and
a shield layer comprising metal, the shield layer being formed by covering a surface of the second resin layer and side surfaces of the first resin layer and the substrate such that the metal shield layer is electrically connected with the ground electrode.

20. The encapsulated circuit module according to claim 19, wherein a same type of resin as that contained as a major resin component in the first resin is used as the second resin.

* * * * *